(12) United States Patent
Yang et al.

(10) Patent No.: US 9,698,232 B2
(45) Date of Patent: Jul. 4, 2017

(54) CONDUCTIVE CAP FOR METAL-GATE TRANSISTOR

(71) Applicant: QUALCOMM Incorporated, San Diego, CA (US)

(72) Inventors: Haining Yang, San Diego, CA (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/661,953

(22) Filed: Mar. 18, 2015

(65) Prior Publication Data

US 2016/0276455 A1    Sep. 22, 2016

(51) Int. Cl.

| H01L 21/8234 | (2006.01) |
|---|---|
| H01L 29/49 | (2006.01) |
| H01L 21/768 | (2006.01) |
| H01L 21/28 | (2006.01) |
| H01L 29/423 | (2006.01) |
| H01L 29/51 | (2006.01) |
| H01L 21/3213 | (2006.01) |
| H01L 23/528 | (2006.01) |
| H01L 23/532 | (2006.01) |
| H01L 29/06 | (2006.01) |
| H01L 29/66 | (2006.01) |
| H01L 29/78 | (2006.01) |

(52) U.S. Cl.
CPC .... *H01L 29/4958* (2013.01); *H01L 21/28079* (2013.01); *H01L 21/28114* (2013.01); *H01L 21/28247* (2013.01); *H01L 21/32133* (2013.01); *H01L 21/7684* (2013.01); *H01L 21/76877* (2013.01); *H01L 21/76897* (2013.01); *H01L 21/823475* (2013.01); *H01L 23/528* (2013.01); *H01L 23/53238* (2013.01); *H01L 29/0649* (2013.01); *H01L 29/42376* (2013.01); *H01L 29/4966* (2013.01); *H01L 29/517* (2013.01); *H01L 29/66568* (2013.01); *H01L 29/78* (2013.01)

(58) Field of Classification Search
CPC ....... H01L 21/64; H01L 21/70; H01L 21/702; H01L 21/8232; H01L 29/66007
See application file for complete search history.

(56) References Cited

U.S. PATENT DOCUMENTS 6,207,514 B1  3/2001  Furukawa et al.
8,421,077 B2  4/2013  Jain et al.
(Continued)

OTHER PUBLICATIONS

Chatterjee, Amitava et al., "A Transistor Performance Figure-of-Merit Including the Effect of Gate Resistance and its Application to Scaling to sub-0.25-µm CMOS Logic Technologies," IEEE Transactions on Electron Devices, Jun. 1998, vol. 45, No. 6, pp. 1246-1252.

(Continued)

*Primary Examiner* — Cheung Lee
(74) *Attorney, Agent, or Firm* — Toler Law Group, PC

(57) ABSTRACT

A semiconductor device includes a gate region, a conductive cap, and an interconnect. The gate region (e.g., a metal-gate transistor) includes a metal gate region and a high dielectric constant (high-K) gate dielectric region. The conductive cap is disposed on a surface of the metal gate region and on a surface of the high-K gate dielectric region, and the interconnect is disposed on the conductive cap. The conductive cap includes a conductive material that electrically connects the gate region to the interconnect.

26 Claims, 20 Drawing Sheets

(56) References Cited

U.S. PATENT DOCUMENTS

| | | | |
|---|---|---|---|
| 8,436,404 B2 | 5/2013 | Bohr et al. | |
| 8,877,645 B2 | 11/2014 | Yang et al. | |
| 9,190,488 B1* | 11/2015 | Park | H01L 29/518 |
| 2013/0069161 A1* | 3/2013 | Yang | H01L 21/76888 |
| | | | 257/368 |
| 2013/0140634 A1* | 6/2013 | Chan | H01L 21/76886 |
| | | | 257/347 |
| 2014/0070333 A1 | 3/2014 | Cheng et al. | |
| 2014/0154877 A1 | 6/2014 | Besser et al. | |
| 2014/0273386 A1* | 9/2014 | Tsao | H01L 29/665 |
| | | | 438/301 |

OTHER PUBLICATIONS

Wachnik, Richard A. et al., "Gate Stack Resistance and Limits to CMOS Logic Performance," IEEE Transactions on Circuits and Systems I: Regular Papers, 2014, vol. 61 (8), pp. 2318-2325.

Goswami I., et al. "Transition Metals Show Promise as Copper Barriers," Semiconductor International, Cahners Pub., Newton, MAS, IL, US, vol. 27 (5), May 1, 2004, pp. 49-54, XP008072872, ISSN: 0163-3767, the whole document.

International Search Report and Written Opinion—PCT/US2016/020628—ISA/EPO—May 20, 2016.

Motte P., et al., "TiN-CVD Process Optimization for Integration with Cu-CVD," Microelectronic Engineering, Elsevier Publishers BV., Amsterdam, NL, vol. 50 (1-4), Jan. 1, 2000, pp. 369-374, XP004237690, ISSN: 0167-9317, DOI: 10.1016/S0167-9317(99)00304-4, p. 369-p. 371.

Yan H., et al., "Amorphous Metallic Thin Films as Copper Diffusion Barrier for Advanced Interconnect Applications," 11th Electronics Packaging Technology Conference, Dec. 9, 2009, pp. 567-572, XP031630378, ISBN: 978-1-4244-5099-2, p. 567-568.

Samavedam S. B., et al., "Elevated Source rain Devices Using Silicon Selective Epitaxial Growth", Journal of Vacuum Science & Technology B: Microelectronics processing and Phenomena, American Vacuum Society, New York, NY, US, vol. 18, No. 3, May 1, 2000, XP012008182, pp. 1244-1250.

* cited by examiner

CONDUCTIVE CAP FOR METAL-GATE TRANSISTOR

I. FIELD

The present disclosure is generally related to metal-gate transistors and more particularly to high dielectric constant (high-K) metal-gate (HKMG) transistors.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These computing devices can communicate voice and data packets over wireless networks. Further, many such computing devices incorporate additional functionality such as a digital still camera, a digital video camera, a digital recorder, and an audio file player. Also, such computing devices can process executable instructions, including software applications, such as a web browser application, that can be used to access the Internet. As such, these computing devices can include significant computing capabilities.

To enable the computing capabilities, the computing devices include processors. As technology advances, these processors include more and more electronic devices (e.g., transistors) and the electronic devices become smaller. A smaller electronic device (e.g., a metal-gate transistor) may include a smaller metal-gate. To illustrate, use of a 16 nanometer (nm) complementary oxide-metal-semiconductor (CMOS) process technology enables reduced transistor size as compared to a 20 nm CMOS process technology. In this example, transistor gate oxide thickness may be less using the 16 nm process technology than using the 20 nm process technology.

In some cases, a circuit fabricated using a smaller process technology (i.e., process technology to fabricate devices at a smaller size) may operate differently than a circuit fabricated using a larger process technology (i.e., process technology to fabricate devices at a larger size). As an example, leakage current may increase for a smaller process technology and a smaller gate oxide thickness, resulting in increased power consumption.

A high dielectric constant (high-K) metal-gate (HKMG) transistor may include a metal gate material formed on a high-K dielectric material. The high-k dielectric material may reduce leakage current as compared to a transistor that includes a poly-silicon gate and gate oxide materials.

For smaller process technologies, the metal gate material may have a small size that increases resistance of the HKMG transistor (e.g., due to decreased transistor gate width). Increased gate resistance can reduce performance of an electronic device. For example, increased gate resistance may be associated with greater power consumption and slower circuit operation.

III. SUMMARY

Boundary areas between various layers of an HKMG transistor may allow for solid-state diffusion of interconnect material into a substrate, potentially resulting in damage to the substrate. To illustrate, a gate region of an HKMG transistor may include a "gate metal region" (that includes a gate conductor material (e.g., a gate metal) and one or more work function materials) and a high-K gate dielectric region. The materials of the gate metal region and the high-K gate dielectric region may be arranged in "vertical" layers that are substantially perpendicular to a surface of the substrate. In cases where an interconnect material directly overlies the vertical layers of the HKMG transistor, the boundary areas between the vertical layers may allow for solid-state diffusion of interconnect material into the substrate, potentially causing damage to the substrate. To address this issue (i.e., to reduce or avoid solid-state diffusion), a conductive cap is disposed on a gate region of a metal-gate transistor (e.g., an HKMG transistor), and an interconnect is disposed on the cap.

The cap (e.g., a "horizontal" layer that is substantially parallel to a surface of the substrate and that overlies the vertical layers) may substantially inhibit diffusion of interconnect material (e.g., copper) that may cause damage to an underlying substrate, allowing copper (Cu) material to be used as the interconnect material. Further, the cap may substantially inhibit diffusion of work function material into the interconnect that may result in threshold voltage (Vt) fluctuation. Because copper is associated with better electrical properties (e.g., lower resistance) than other interconnect materials (e.g., tungsten), performance of a transistor having copper interconnects may be increased as compared to a device that includes a gate region directly connected to a tungsten interconnect.

In a particular aspect, a semiconductor device is disclosed. The semiconductor device includes a gate region, a conductive cap, and an interconnect. The gate region includes a metal gate region and a high dielectric constant (high-K) gate dielectric region. The conductive cap is disposed on a surface of the metal gate region and on a surface of the high-K gate dielectric region, and the interconnect is disposed on the conductive cap. The conductive cap includes a conductive material that electrically connects the gate region to the interconnect.

In another particular aspect, a method of fabricating a semiconductor device includes forming a gate region on a substrate. The gate region includes a metal gate region and a high-K gate dielectric region. The method includes removing a first portion of material from the metal gate region and a second portion of material from the high-K gate dielectric region. The method further includes forming a cap on a surface of the metal gate region and on a surface of the high-K gate dielectric region, and forming an interconnect on the cap. The cap includes a conductive material to electrically connect the interconnect to the gate region.

In another particular aspect, an apparatus is disclosed that includes means for gating a channel of semiconductor device. The means for gating includes a metal gate region and a high-K gate dielectric region. The apparatus also includes means for capping the metal gate region and the high-K gate dielectric region. The apparatus further includes means for interconnecting the means for capping to circuitry of the semiconductor device.

In another particular aspect, a non-transitory computer-readable medium stores instructions that are executable by a processor to perform various operations. The operations include initiating formation of a gate region on a substrate. The gate region includes a metal gate region and a high-K gate dielectric region. The operations further include initiating removal of a first portion of material from the metal gate region and a second portion of material from the high-K gate dielectric region. The operations include initiating formation of a cap on a surface of the metal gate region and on a surface of the high-K gate dielectric region. The operations also include initiating formation of an interconnect on the cap. The cap includes a conductive material that electrically connects the interconnect to the gate region.

One particular advantage provided by at least one of the disclosed aspects is a reduced likelihood of damage to a substrate that may result from diffusion of interconnect material into a substrate. In the present disclosure, a metal-gate transistor (e.g., an HKMG transistor) may include a conductive cap positioned to substantially inhibit diffusion of interconnect material into the substrate. The cap may allow a high-conductivity material such as copper (Cu) to be used as the interconnect material in order to compensate for increased gate metal resistance that is associated with a reduction of dimensions of a gate metal (e.g., when a channel length is reduced to less than 20 nanometers).

Another advantage provided by at least one of the disclosed aspects is a reduction of diffusion of work function material (e.g., of one or more work function layers of a metal-gate transistor) that may occur when an interconnect directly overlies the work function material. Diffusion of work function material into the interconnect may result in threshold voltage (Vt) fluctuation. Positioning the cap between the work function material and the interconnect may reduce Vt fluctuation by substantially inhibiting diffusion of the work function material into the interconnect.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 19:
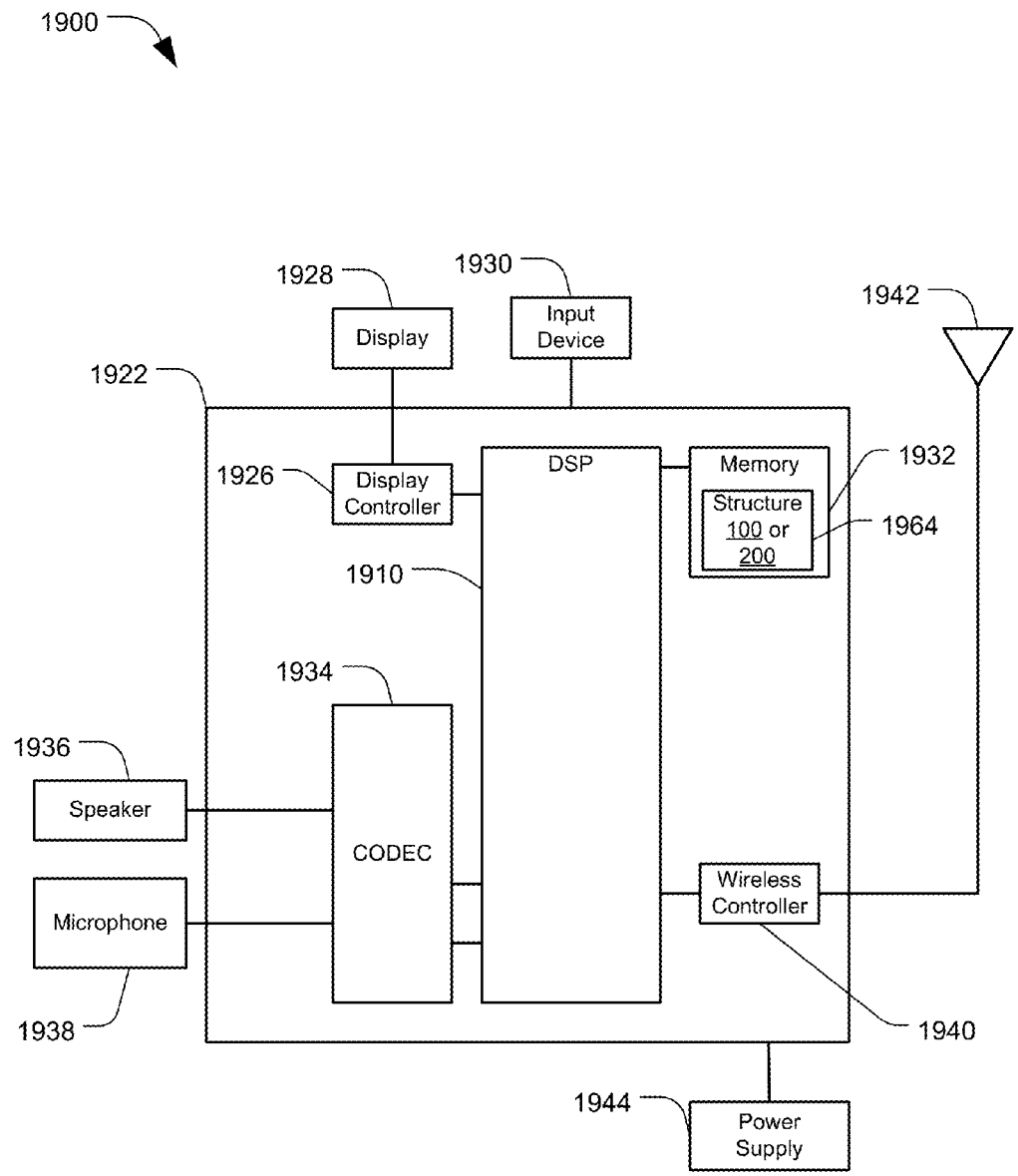
Figure 20:
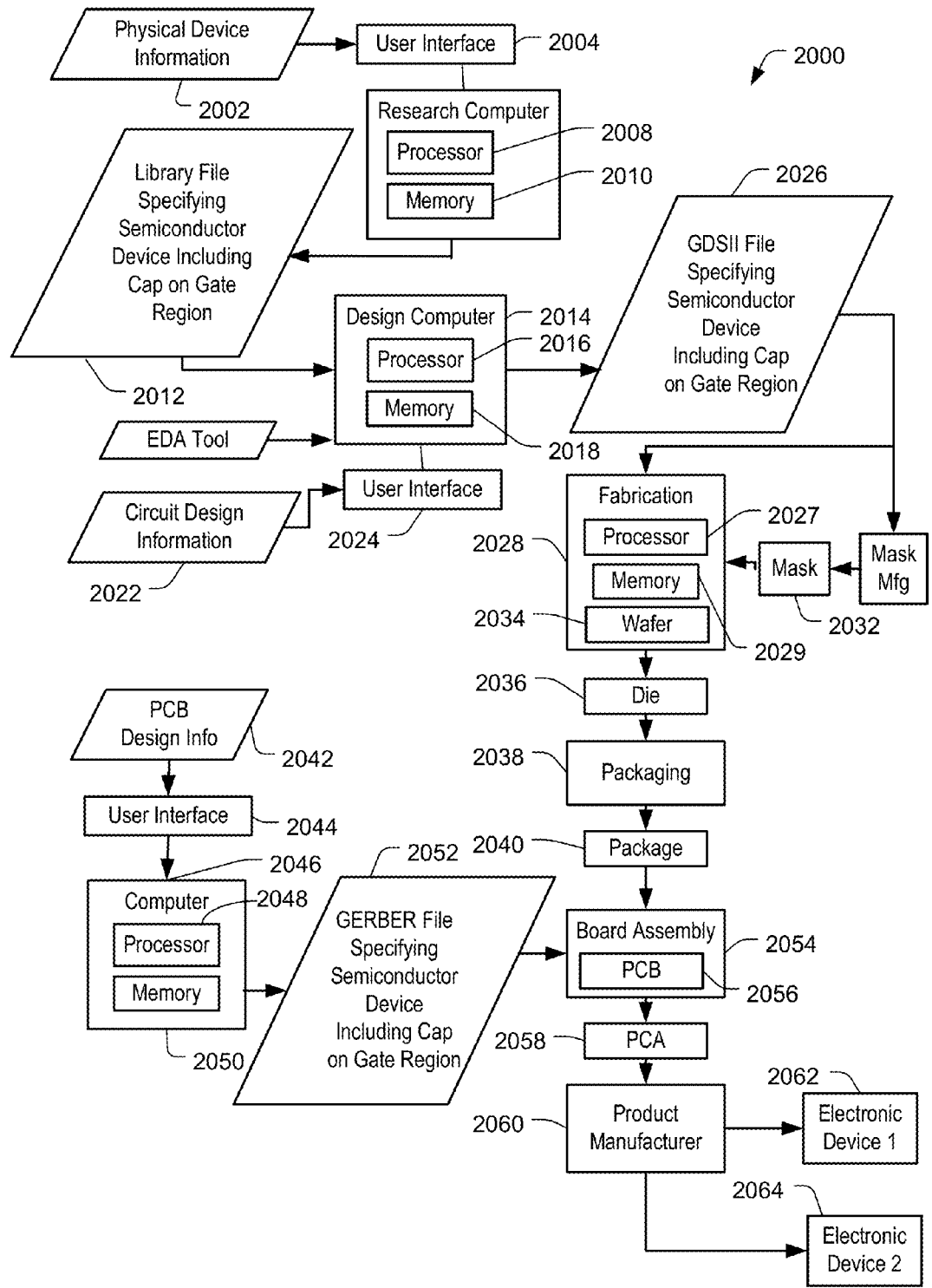

FIG. 19 is a block diagram of an electronic device including a semiconductor device having a conductive cap that is disposed on a gate region (of a metal-gate transistor) in order to electrically connect an interconnect to the gate region; and FIG. 20 is a data flow diagram of a particular illustrative example of a manufacturing process to manufacture electronic devices that include a semiconductor device having a conductive cap that is disposed on a gate region (of a metal-gate transistor) in order to electrically connect an interconnect to the gate region.

V. DETAILED DESCRIPTION

Figure 1:
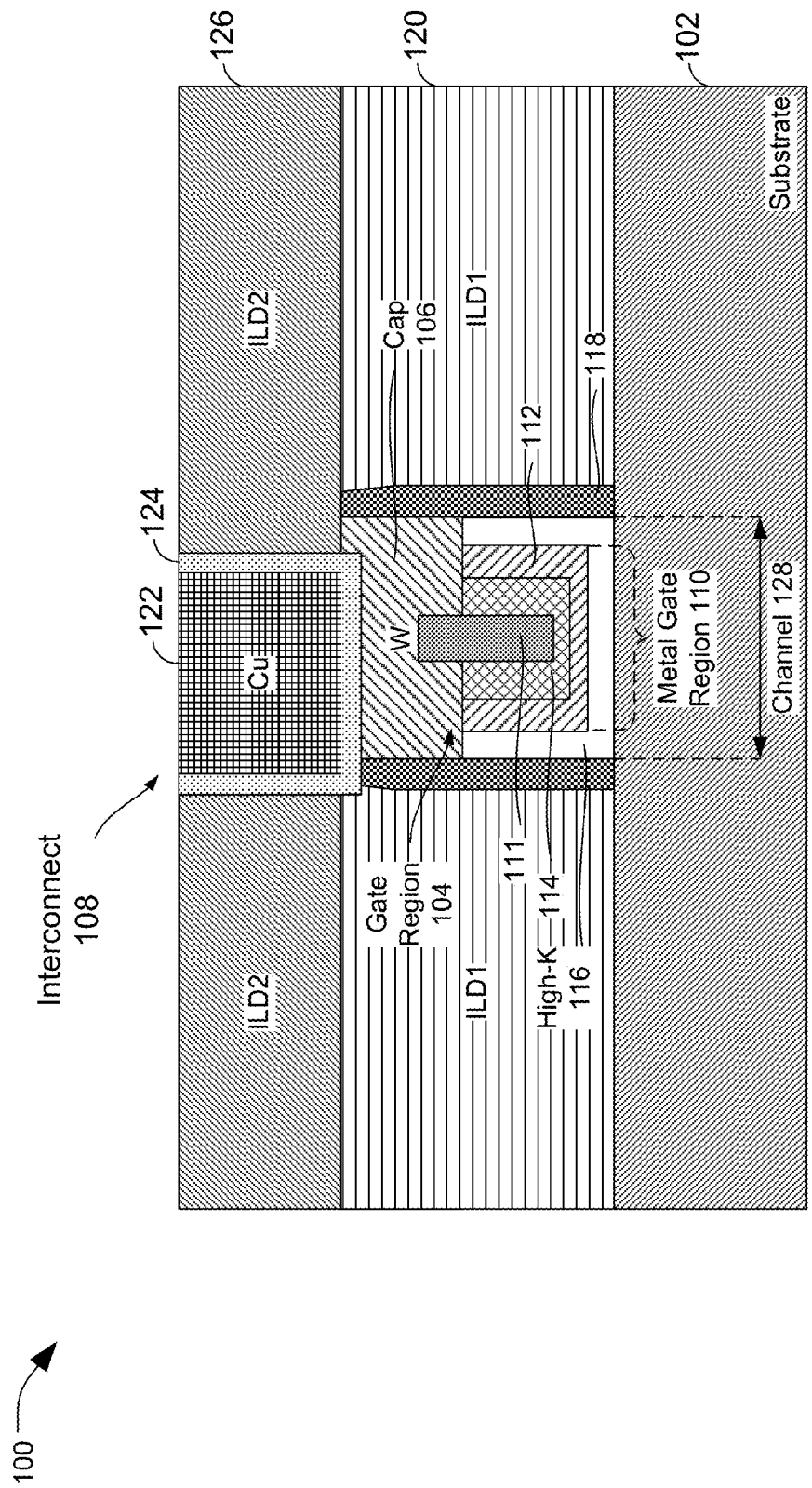
FIG. 1 is a diagram of a side view of an illustrative example of a structure during at least one stage in a process of fabricating an electronic device.
Figure 2:
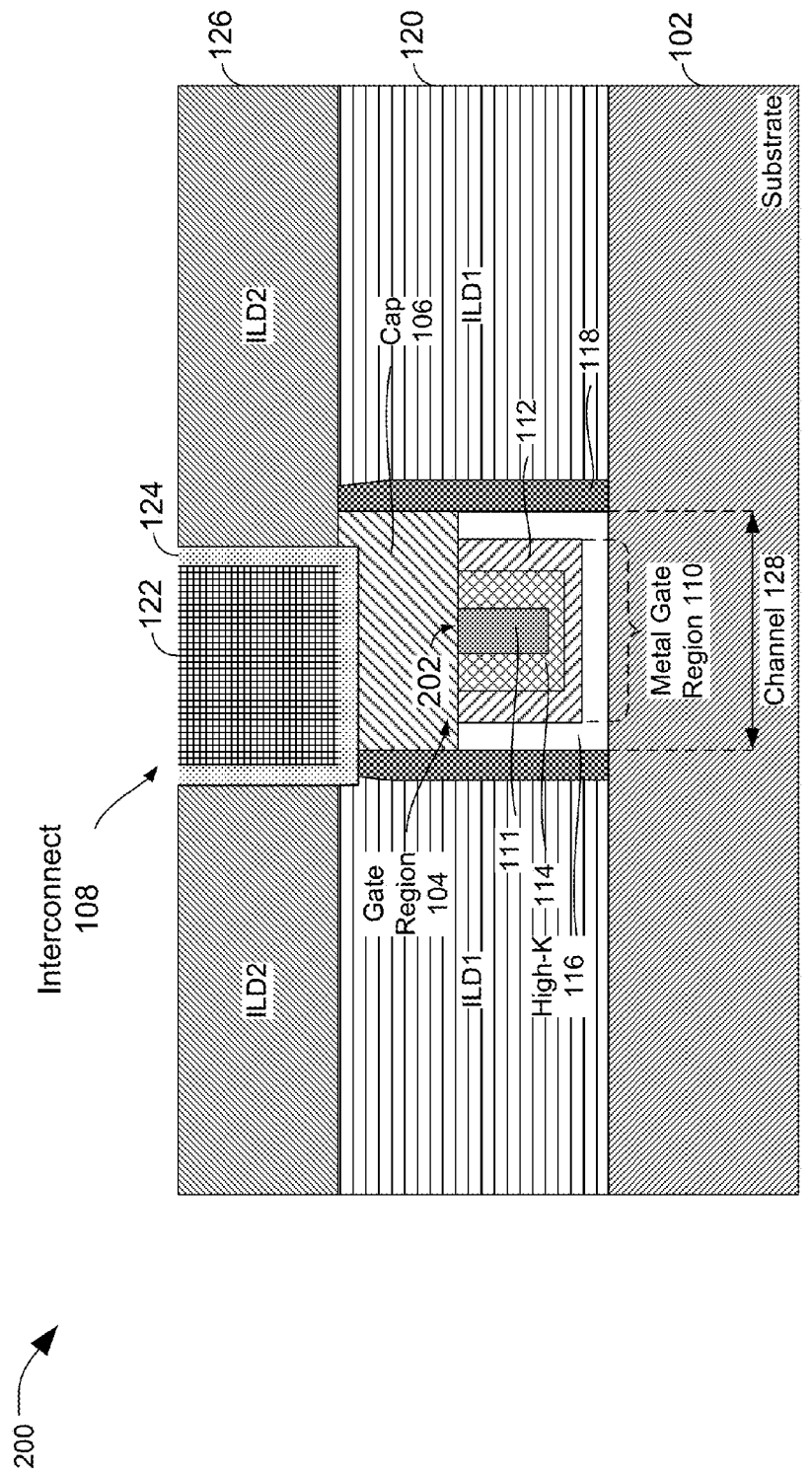
FIG. 2 is a diagram of a side view of another illustrative example of a structure during at least one stage in a process of fabricating an electronic device.
Figure 3:
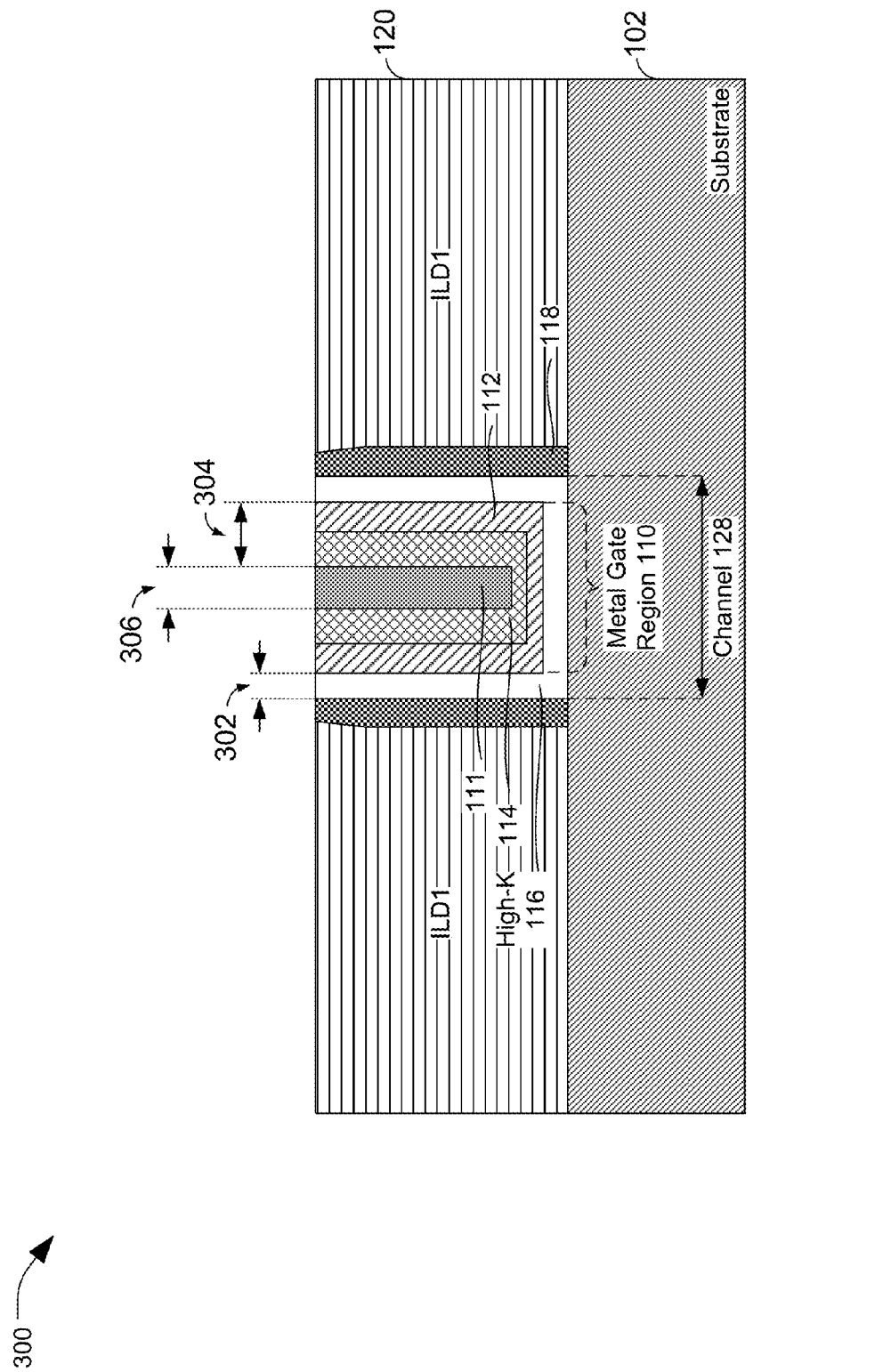
FIG. 3 is a diagram of a side view of the structure of FIG. 1 or FIG. 2 during at least one stage in a process of fabricating an electronic device.

FIG. 1, as described herein, illustrates a side view of a first instance of a structure 100. FIG. 2, as described herein, illustrates a side view of a second instance of a structure 200. FIG. 3, as described herein, illustrates a side view of a structure 300 during a particular stage of a process of fabricating an electronic device (e.g., a semiconductor device, an integrated circuit device, or another electronic device) that includes the structure 100 of FIG. 1 or the structure 200 of FIG. 2. FIGS. 4-10, as described herein, illustrate side views of structures as formed during multiple stages of a process of fabricating an electronic device that includes the structure 100 of FIG. 1. FIGS. 11-17, as described herein, illustrate side views of structures as formed during multiple stages of a process of fabricating an electronic device that includes the structure 200 of FIG. 2.

Referring to FIG. 1, a diagram of a side view of a structure as formed during a process of fabricating an electronic device is disclosed and generally designated 100. The structure 100 includes a substrate 102, a gate region 104, a (conductive) cap 106 disposed on the gate region 104, and an interconnect 108 disposed on the cap 106. The gate region 104 may be included in a high-K metal-gate (HKMG) transistor. The gate region 104 may be connected to source/drain regions of the substrate 102. FIG. 1 illustrates a particular example of an HKMG implementation in which the gate region 104 includes a metal gate region 110 (that includes a gate metal layer 111, a first work function layer 112, and a second work function layer 114) and a high-K dielectric layer 116 (e.g., a high-K gate dielectric region that includes a high-K layer disposed adjacent to the second work function layer 114). Thus, FIG. 1 illustrates that the cap 106 is disposed on a surface of the metal gate region 110 and on a surface of the high-K gate dielectric region (e.g., the high-K layer 116). A spacer material 118 may be connected to the gate region 104, and the spacer material 118 may be in contact with (or disposed within) a first interlayer dielectric (ILD1) 120 that is disposed on a surface of the substrate 102.

The cap 106 may include a conductive material to electrically connect the gate region 104 to the interconnect 108. The conductive material may include one or more of tungsten (W), cobalt (Co), or tantalum (Ta), as illustrative examples. The interconnect 108 may include a metal conductor 122 such as copper (Cu), and the cap 106 may substantially inhibit (e.g., prevent or reduce) diffusion of the metal conductor 122 into the gate region 104. Further, the cap 106 may substantially inhibit (e.g., prevent or reduce) diffusion of work function material(s) associated with the first work function layer 112 and/or the second work function layer 114 from the gate region 104 into the interconnect 108. In the example of FIG. 1, the interconnect 108 may further include a liner material 124 positioned between the metal conductor 122 and the cap 106 to further inhibit diffusion of material (e.g., interconnect material and/or work function material). The structure 100 may further include a second interlayer dielectric (ILD2) layer 126.

In operation, a supply voltage may be applied to the structure 100 via the metal conductor 122 (e.g., Cu) of the interconnect 108. The conductive material (e.g., W) of the cap 106 electrically connects the interconnect 108 to the gate region 104. The gate region 104 may be electrically connected to source/drain regions (not shown) of the substrate 102 via the channel 128 in the first ILD layer 120 that exposes a surface of the substrate 102. In operation, the cap 106 may substantially inhibit solid-state diffusion of material from the interconnect 108 into the gate region 104, allowing higher conductivity material(s), such as Cu, to be used as the conductor 122. Further, in operation, the cap 106 may substantially inhibit solid-state diffusion of work function material (e.g., work function materials associated with the work function layers 112, 114) from the metal gate region 110 into the interconnect 108, reducing or eliminating threshold voltage (Vt) fluctuation caused by such diffusion.

For illustrative purposes only, FIG. 1 illustrates that a portion of the interconnect 108 may overly a portion of one of the spacers 118. While a selected portion of material in the second ILD layer 126 that directly overlies the cap 106 may be targeted for removal (e.g., etching) in order to expose the cap 106, in practice it may be difficult to precisely remove only the selected portion. Thus, FIG. 1 illustrates a degree of imprecision in the removal of material from the second ILD layer 126. It will be appreciated that in some cases the portion of material in the second ILD layer 126 that is removed may expose the cap 106 without removal of a portion of material from the spacers 118 (i.e., the interconnect 108 may overly the cap 106 but may not overly the spacers 118).

In FIG. 2, an alternative example of a transistor is depicted and generally designated 200. In the example of FIG. 2, a portion of the gate region 104 has been smoothed (e.g., etched and/or planarized) to form a surface 202 (e.g., a substantially flat surface). The cap 106 is formed on the surface 202. Forming the cap 106 on the surface 202 may simplify a deposition process used to fill materials of the cap 106, such as by facilitating use of a conformal deposition process. Other aspects of the structure 200 of FIG. 2 are similar to the structure 100 described with respect to FIG. 1.

Referring to FIG. 3, a diagram of a side view of a structure as formed during a process of fabricating an electronic device is illustrated and generally designated 300. The structure 300 may include spacers 118 (e.g., silicon mononitride (SiN) spacers) on a portion of the substrate 102. A high dielectric constant (high-K) layer 116 (e.g., a hafnium dioxide ($HfO_2$) layer) may be deposited on the substrate 102. For example, the high-K layer 116 may be deposited using atomic layer deposition (ALD), among other alternatives. The first work function layer 112 may be deposited on the high-K layer 116, and the second work function layer 114 may be deposited on the first work function layer 112.

The first ILD layer 120 is disposed on a surface of the substrate 102. The channel 128 is defined by a recess in the first ILD layer 120 that is formed by removing (e.g., etching) a portion of the first ILD layer 120 to expose a portion of the surface of the substrate 102. A "channel length" of the channel 128 may correspond to a distance between the spacers 118 on the exposed portion of the substrate 102. In a particular instance, the channel length of the channel 128 may be less than 20 nanometers (nm). FIG. 3 illustrates that a first portion 302 of the channel length may correspond to a dimension of the high-K layer 116, a second portion 304 of the channel length may correspond to a dimension of one or more work function layers (e.g., the first work function layer 112 and the second work function layer 114), and a third portion 306 of the channel length may correspond to a dimension of the gate metal layer 111 of the metal gate region 110.

As an illustrative, non-limiting example, the first portion 302 of the channel length may be about 1 nm (e.g., within a range of about 0.25 nm to about 1.75 nm, within a range of about 0.5 nm to about 1.5 nm, or within a range of about 0.75 nm to about 1.25 nm). As another example, the second portion 304 of the channel length may be about 5 nm (e.g., within a range of about 3 nm to about 7 nm, within a range of about 4 nm to about 6 nm, or within a range of about 4.5 nm to about 5.5 nm). As a further example, the third portion 306 of the channel length may be about 5 nm (e.g., within a range of about 3 nm to about 7 nm, within a range of about 4 nm to about 6 nm, or within a range of about 4.5 nm to about 5.5 nm).

In a particular instance, the first work function layer 112 may include a p-type metal oxide semiconductor (PMOS) work-function metal layer. The PMOS work-function metal layer may include a metal, a metal alloy (e.g., a compound with a plurality of metals or a compound with at least one metal and at least one non-metal), or an intermetallic layer. The PMOS work-function metal layer may include at least one of tungsten (W), tantalum (Ta), aluminum (Al), cobalt (Co), titanium (Ti), and platinum (Pt). In addition, the PMOS work-function metal layer may include one or more of silicon (Si), carbon (C), and nitrogen (N).

In a particular instance, the second work function layer 114 may include an n-type metal oxide semiconductor (NMOS) work-function metal layer. The NMOS work-function metal layer may include a metal, a metal alloy (e.g., a compound with a plurality of metals or a compound with at least one metal and at least one non-metal), or an intermetallic layer. The NMOS work-function metal layer may include at least one of tantalum (Ta), aluminum (Al), and titanium (Ti). In addition, the NMOS work-function metal layer may include one or more of silicon (Si), carbon (C), and nitrogen (N).

Subsequent to deposition of the first work function layer 112 and the second work function layer 114, a gate metal layer 111 (e.g., a tungsten (W) layer) may be deposited on the structure 300 (e.g., using chemical vapor deposition (CVD)). Chemical mechanical planarization (CMP) may be performed subsequent to deposition of the gate metal layer 111.

Figure 4:
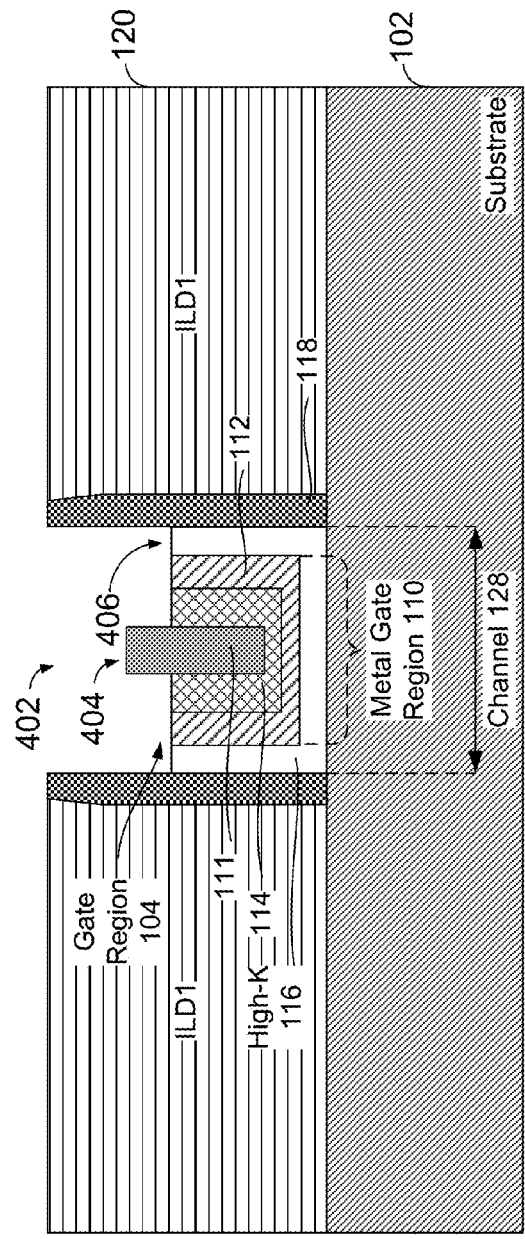
FIG. 4 is a diagram of a side view of the structure of FIG. 1 during at least one stage in a process of fabricating an electronic device.

FIGS. 4-10 illustrate side views of structures as formed during multiple stages of a process of fabricating an electronic device that includes the structure 100 of FIG. 1. Referring to FIG. 4, a diagram of a side view of a structure as formed during a process of fabricating an electronic device (including the structure 100 of FIG. 1) is illustrated and generally designated 400. FIG. 4 illustrates that the structure 300 of FIG. 3 may be etched to remove a portion of material from a metal gate region 110 (e.g., the gate metal layer 111 and the work function layers 112, 114) and to remove a portion of material from a high-K gate dielectric region (e.g., the high-K layer 116). Etching the structure 300 of FIG. 3 results in the formation of a recess 402 (below a surface of the first ILD layer 120). In the particular example illustrated in FIG. 4, the etching of the structure 300 of FIG. 3 results in a surface 404 of the gate metal layer 111 being disposed above and substantially parallel to another surface 406 (associated with the work function layers 112, 114 and the high-K layer 116). In some cases, etch chemical(s) may be utilized to etch the gate metal layer 111 at a first etch rate and to etch the high-K layer 116 (and optionally the work function layers 112, 114) at a second etch rate (that is different from the first etch rate). For example, etching the high-K layer 116 and the work function layers 112, 114 may expose additional surface area of the gate metal layer 111 for contact with the cap 106 (as described further herein with respect to FIG. 5). As further described herein with respect to FIG. 11, the first etch rate and the second etch rate may be substantially the same, resulting in the gate region 104 having a substantially flat surface.

Figure 5:
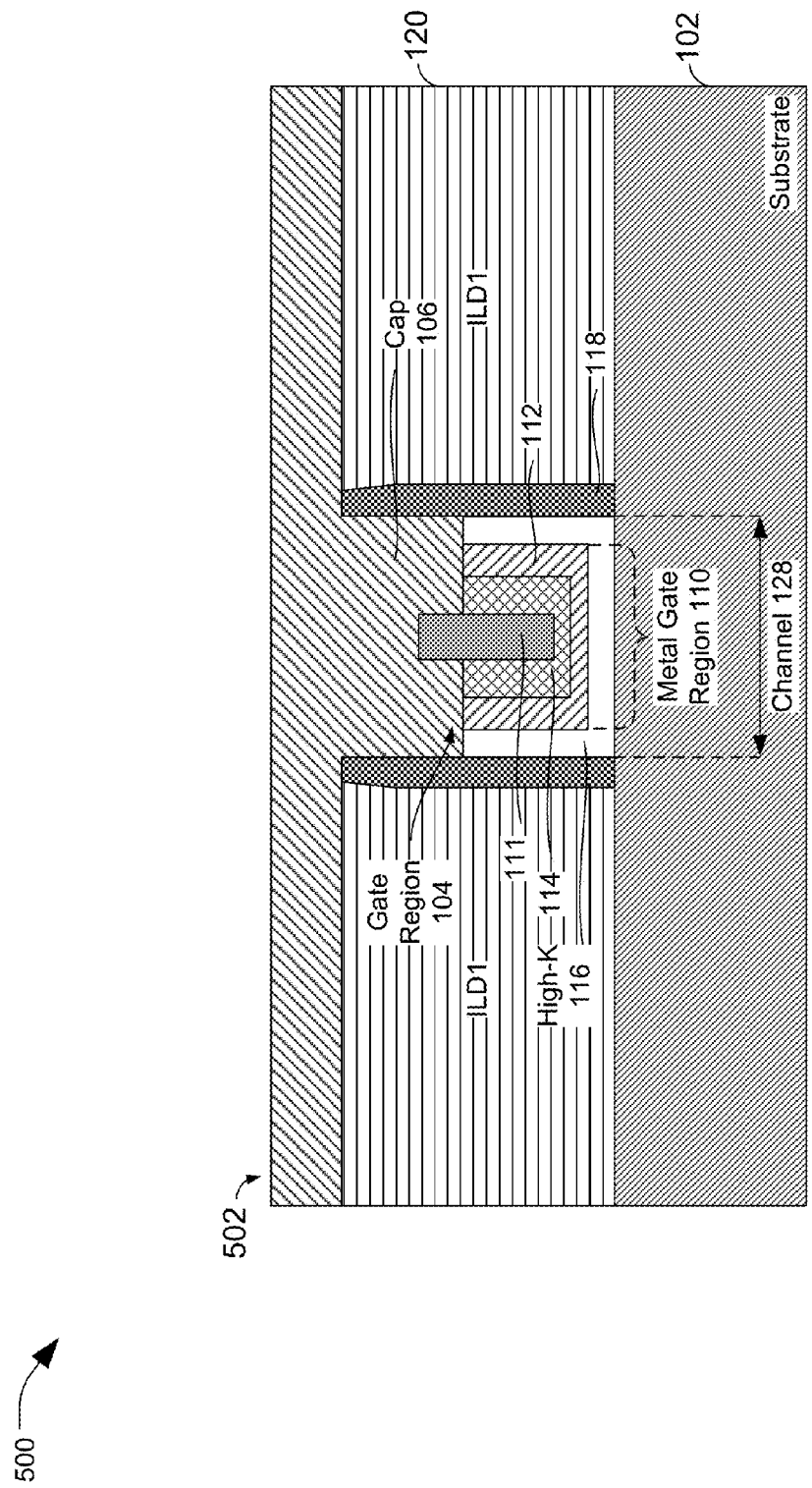
FIG. 5 is a diagram of a side view of the structure of FIG. 1 during at least one stage in a process of fabricating an electronic device.

Referring to FIG. 5, a diagram of a side view of a structure as formed during a process of fabricating an electronic device (including the structure 100 of FIG. 1) is illustrated and generally designated 500. FIG. 5 illustrates the formation of the cap 106 on the gate region 104 of FIG. 4 by depositing cap material 502. For example, forming the cap 106 on the gate region 104 may include depositing a tungsten (W) layer, a cobalt (Co) layer, or a tantalum (Ta) layer on the gate region 104.

Figure 6:
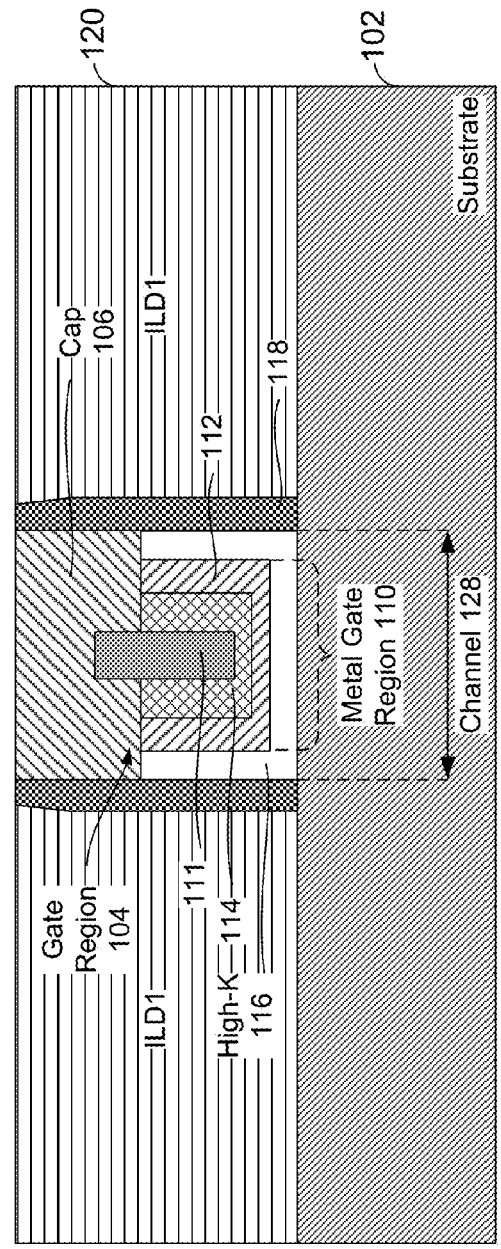
FIG. 6 is a diagram of a side view of the structure of FIG. 1 during at least one stage in a process of fabricating an electronic device.

Referring to FIG. 6, a diagram of a side view of a structure as formed during a process of fabricating an electronic device (including the structure 100 of FIG. 1) is illustrated and generally designated 600. FIG. 6 illustrates that a portion of the cap material 502 of FIG. 5 may be removed from the cap 106 (e.g., by chemical-mechanical planarization (CMP)).

Figure 7:
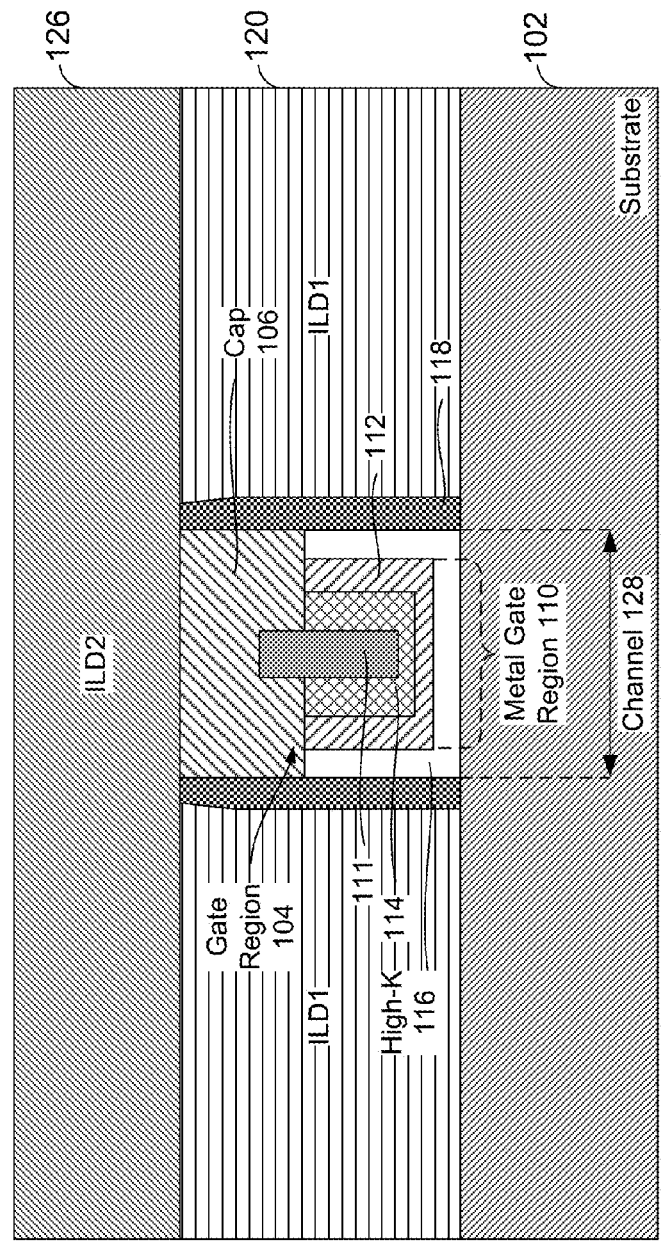
FIG. 7 is a diagram of a side view of the structure of FIG. 1 during at least one stage in a process of fabricating an electronic device.
Figure 8:
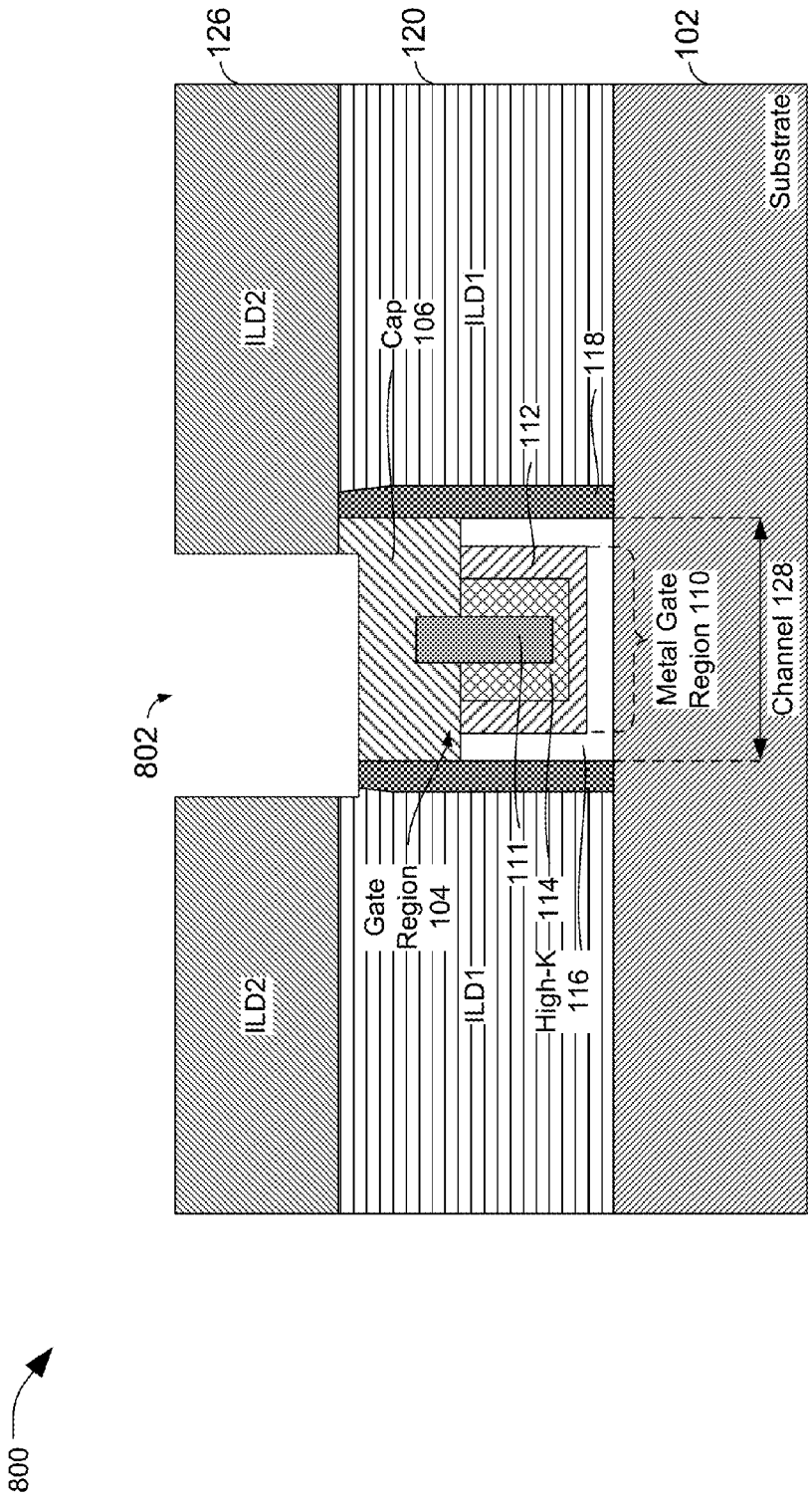
FIG. 8 is a diagram of a side view of the structure of FIG. 1 during at least one stage in a process of fabricating an electronic device.

FIGS. 7-10 illustrate the formation of an interconnect on the cap 106 after chemical-mechanical planarization. Referring to FIGS. 7-10, diagrams of side views of structures as formed during a process of fabricating an electronic device (including the structure 100 of FIG. 1) are illustrated and generally designated 700, 800, 900, and 1000, respectively. FIG. 7 illustrates that the second inter-layer dielectric layer 126 may be formed, and FIG. 8 illustrates that a portion of the second ILD layer 126 may be removed (e.g., etched) to form a recess 802 that exposes a surface of the cap 106. As further explained herein, for illustrative purposes only, FIG. 8 illustrates that forming the recess 802 may also result in removal of a portion of spacer material (and a portion of the cap material).

Figure 9:
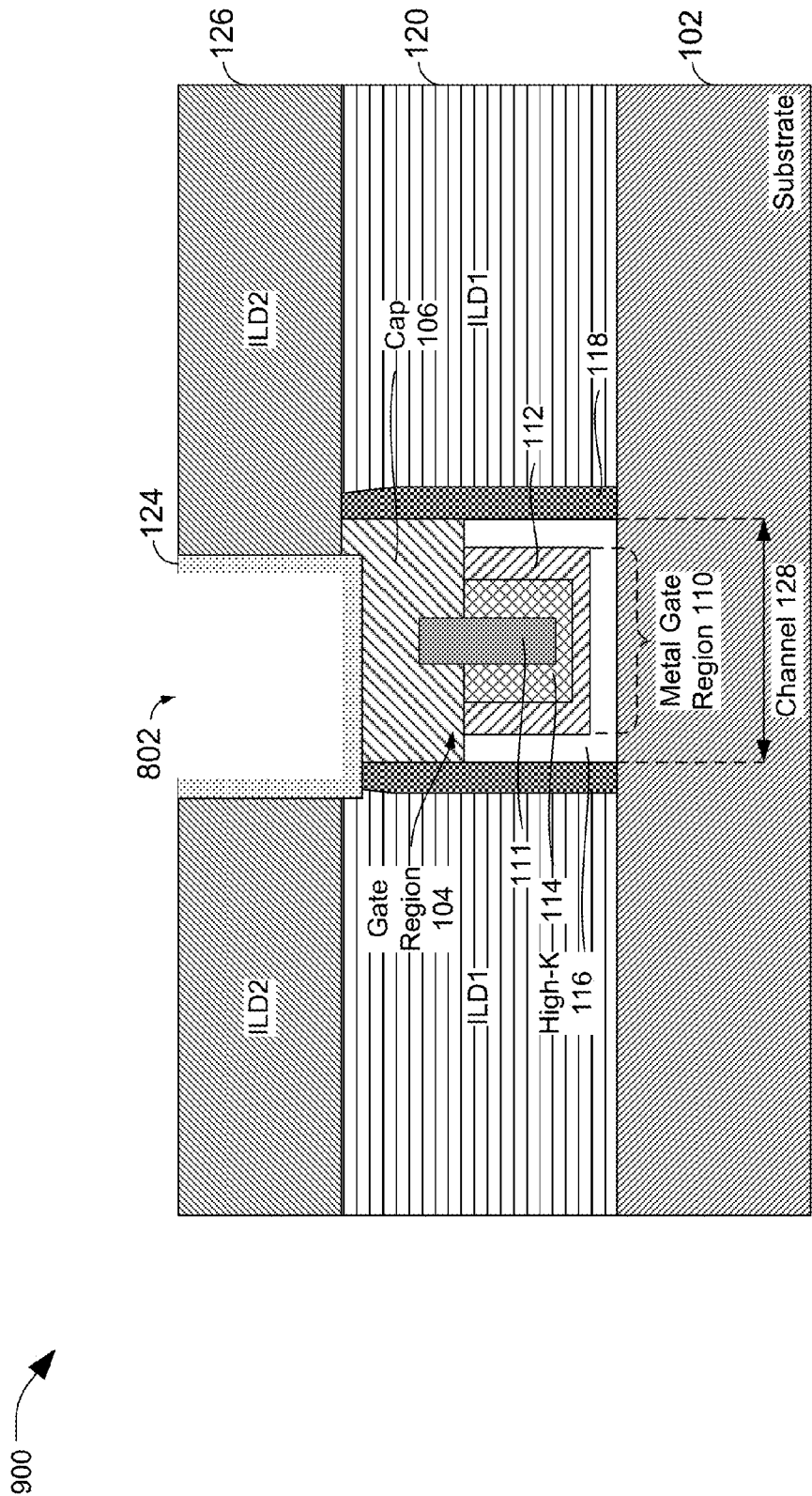
FIG. 9 is a diagram of a side view of the structure of FIG. 1 during at least one stage in a process of fabricating an electronic device.
Figure 10:
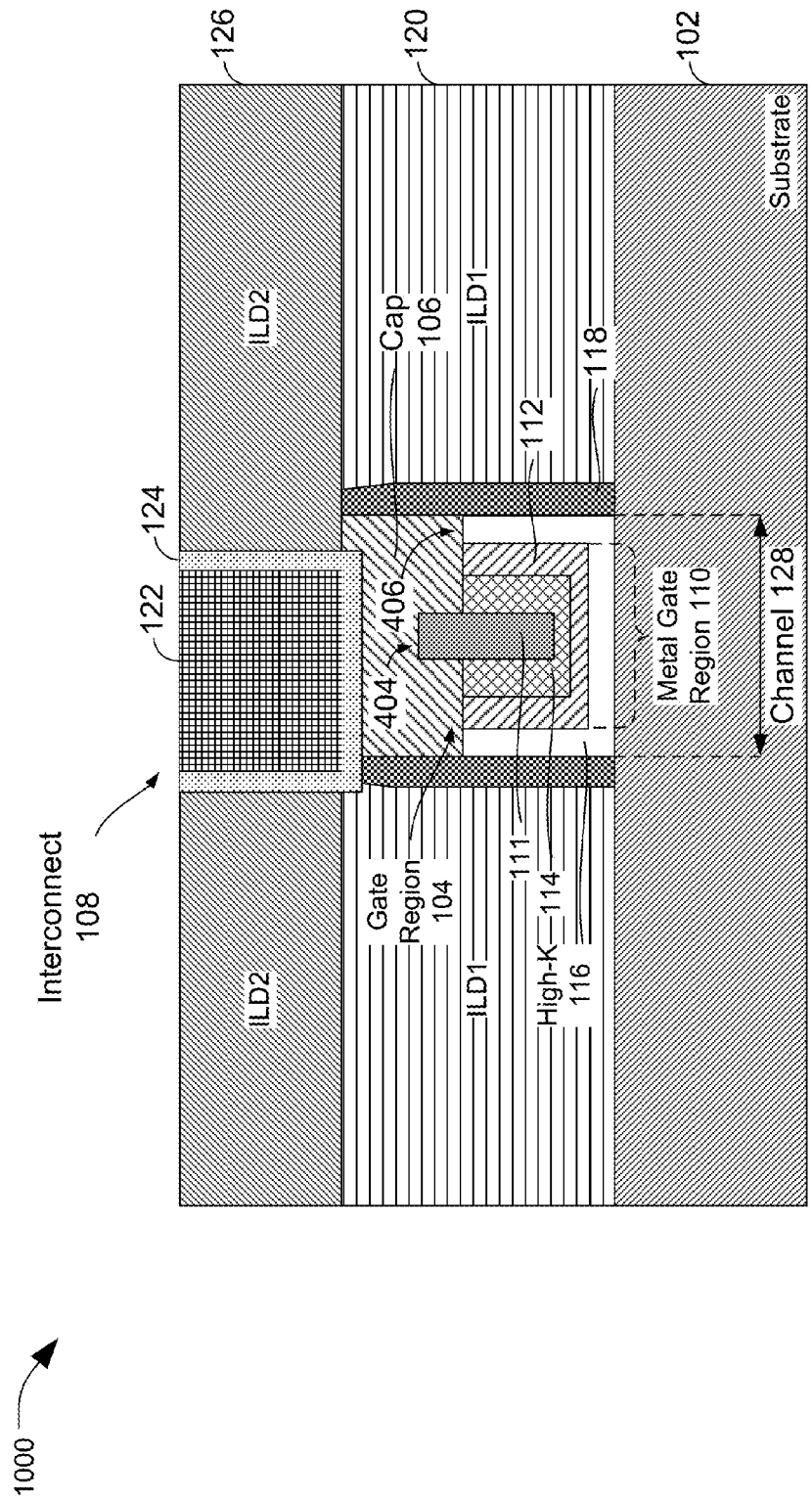
FIG. 10 is a diagram of a side view of the structure of FIG. 1 during at least one stage in a process of fabricating an electronic device.

FIGS. 9 and 10 illustrate a particular implementation in which the liner layer 124 is deposited on the surface of the cap 106 prior to deposition of the interconnect metal 122 (e.g., a copper (Cu) layer). In alternative implementations, the interconnect metal 122 (e.g., Cu) may be deposited on the surface of the cap 106 without the intervening liner layer 124. FIG. 10 illustrates the resulting device 1000 fabricated using the process described in FIGS. 3-10. The device 1000 illustrated in FIG. 10 may correspond to the structure 100 illustrated in FIG. 1. FIG. 10 further illustrates that the surface 404 of the gate metal layer 111 is substantially parallel to the surface 406 of the high-K layer 116 and is disposed at a different distance from the interconnect 108 than the surface 406 of the high-K layer 116.

Figure 11:
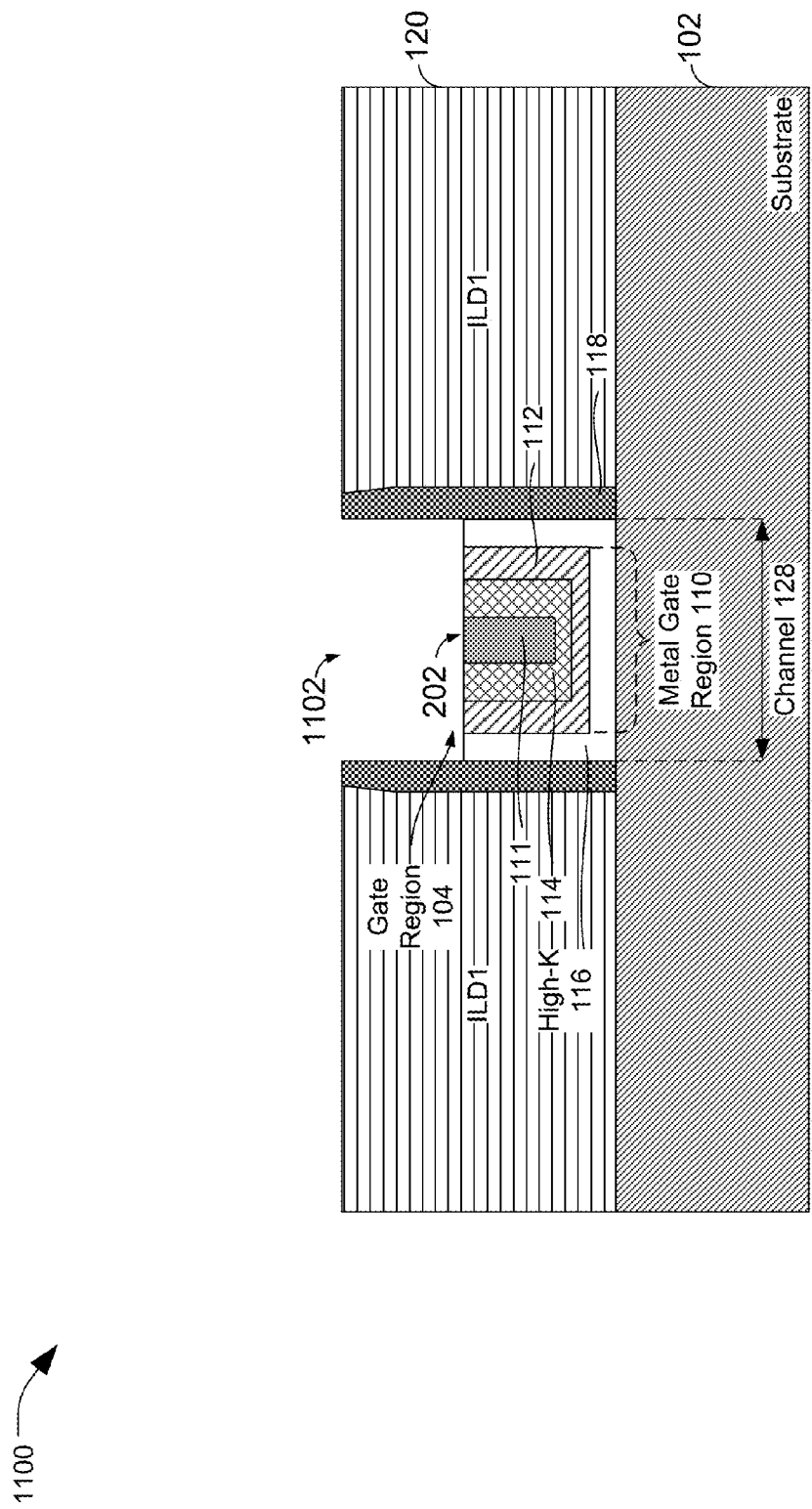
FIG. 11 is a diagram of a side view of the structure of FIG. 2 during at least one stage in a process of fabricating an electronic device.

FIGS. 11-17 illustrate side views of structures as formed during multiple stages of a process of fabricating an electronic device that includes the structure 200 of FIG. 2. Referring to FIG. 11, a diagram of a side view of a structure as formed during a process of fabricating an electronic device (including the structure 200 of FIG. 2) is illustrated and generally designated 1100. FIG. 11 illustrates that the structure 300 of FIG. 3 may be etched to remove a portion of material from a metal gate region 110 (e.g., the gate metal layer 111 and the work function layers 112, 114) and to remove a portion of material from a high-K gate dielectric region (e.g., the high-K layer 116). Etching the structure 300 of FIG. 3 results in the formation of a recess 1102 (below a surface of the first ILD layer 120). In contrast to FIG. 4, FIG. 11 illustrates a particular implementation in which the etching of the structure 300 of FIG. 3 results in the gate region 104 having a substantially flat surface (where a surface of the gate metal layer 111 is substantially parallel to a surface of the high-K layer 116). To produce the substantially flat surface, etch chemical(s) may be utilized to etch the gate metal layer 111, the work function layers 112, 114, and the high-K layer 116 at substantially the same etch rate.

Figure 12:
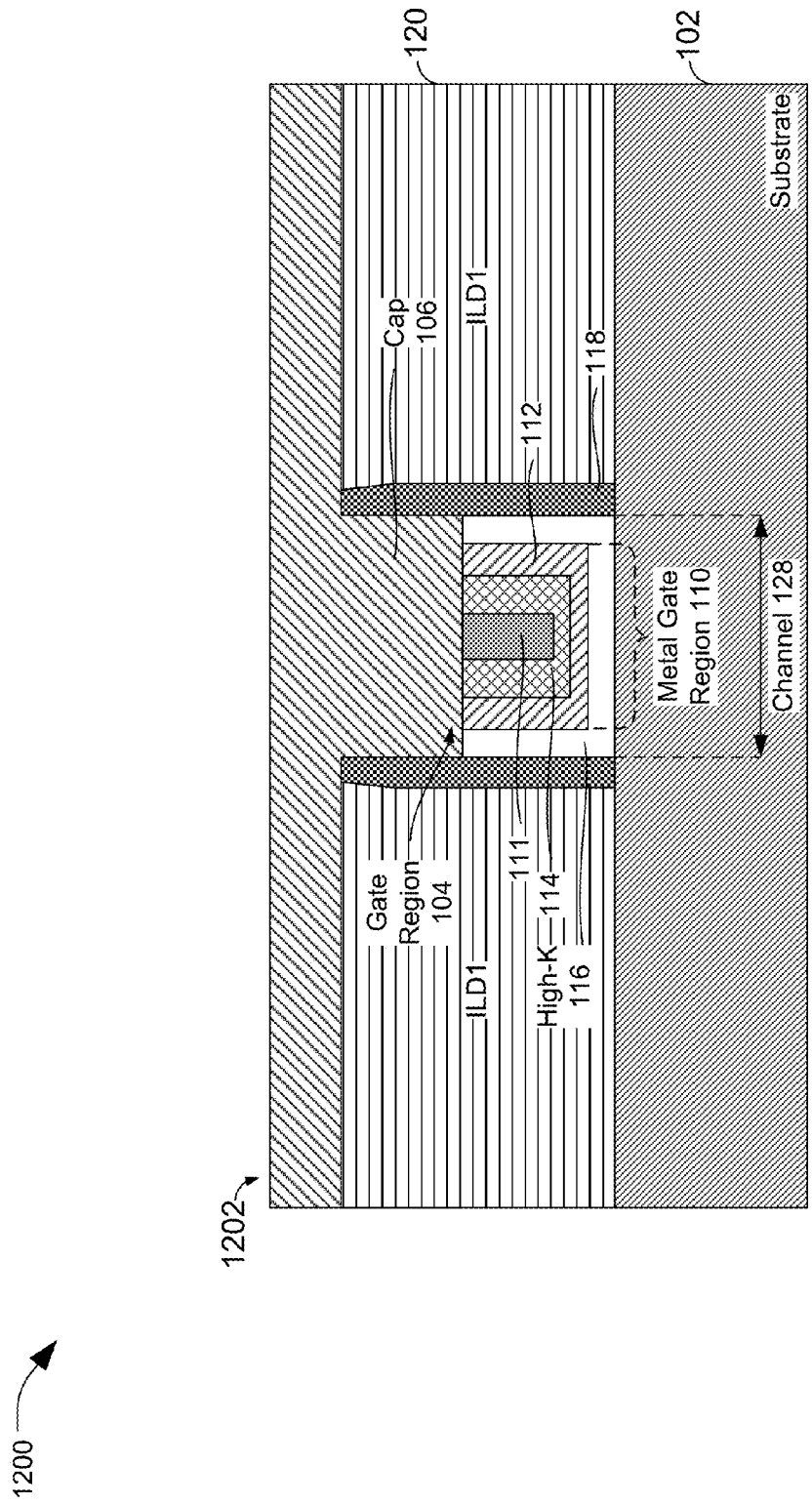
FIG. 12 is a diagram of a side view of the structure of FIG. 2 during at least one stage in a process of fabricating an electronic device.

Referring to FIG. 12, a diagram of a side view of a structure as formed during a process of fabricating an electronic device (including the structure 200 of FIG. 2) is illustrated and generally designated 1200. FIG. 12 illustrates the formation of the cap 106 on the gate region 104 of FIG. 11 by depositing cap material 1202. For example, forming the cap 106 on the gate region 104 may include depositing a tungsten (W) layer, a cobalt (Co) layer, or a tantalum (Ta) layer on the gate region 104.

Figure 13:
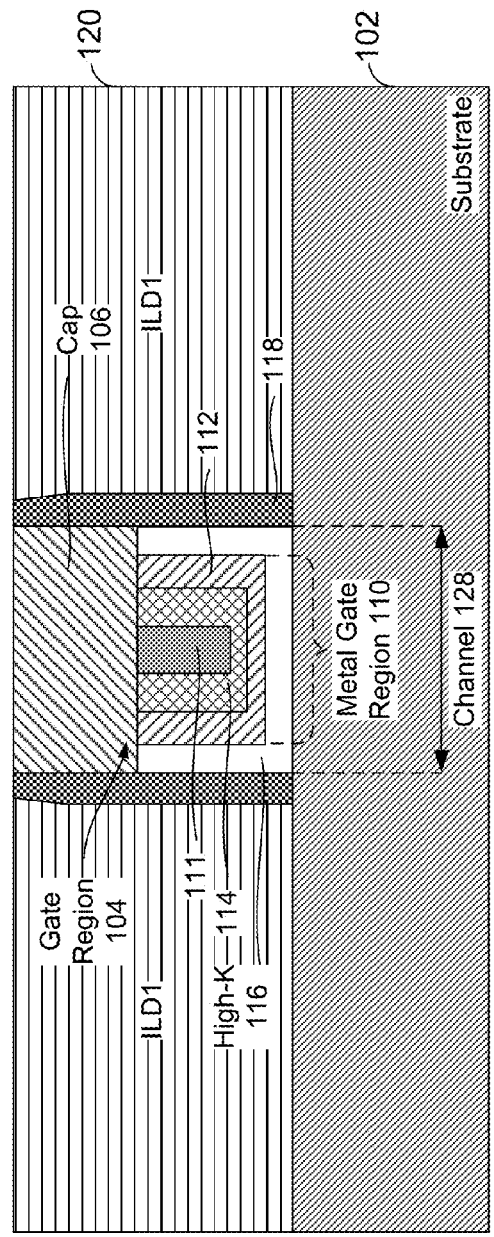
FIG. 13 is a diagram of a side view of the structure of FIG. 2 during at least one stage in a process of fabricating an electronic device.

Referring to FIG. 13, a diagram of a side view of a structure as formed during a process of fabricating an electronic device (including the structure 200 of FIG. 2) is illustrated and generally designated 1300. FIG. 13 illustrates that a portion of the cap material 1202 of FIG. 12 may be removed from the cap 106 (e.g., by chemical-mechanical planarization (CMP)).

Figure 14:
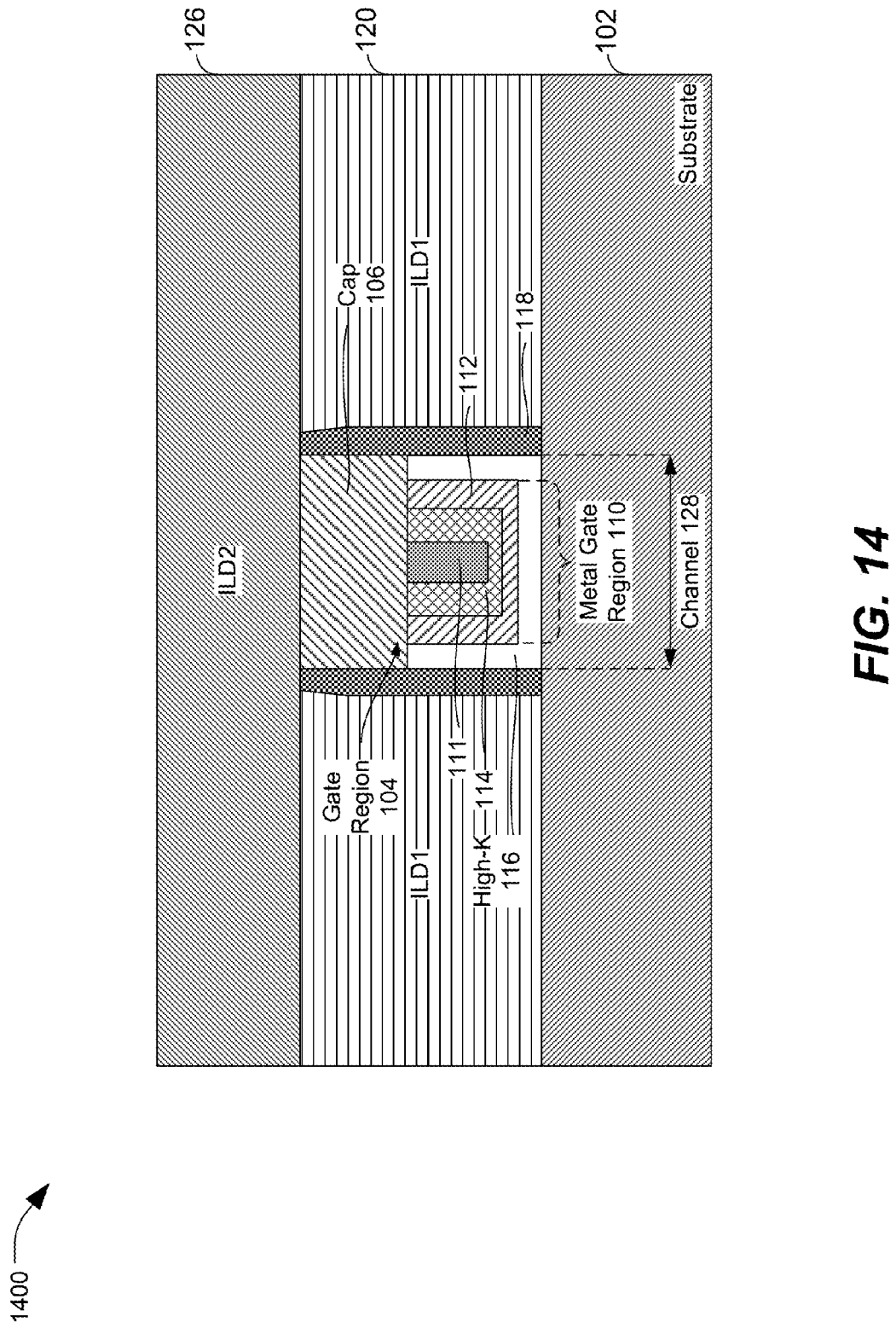
FIG. 14 is a diagram of a side view of the structure of FIG. 2 during at least one stage in a process of fabricating an electronic device.
Figure 15:
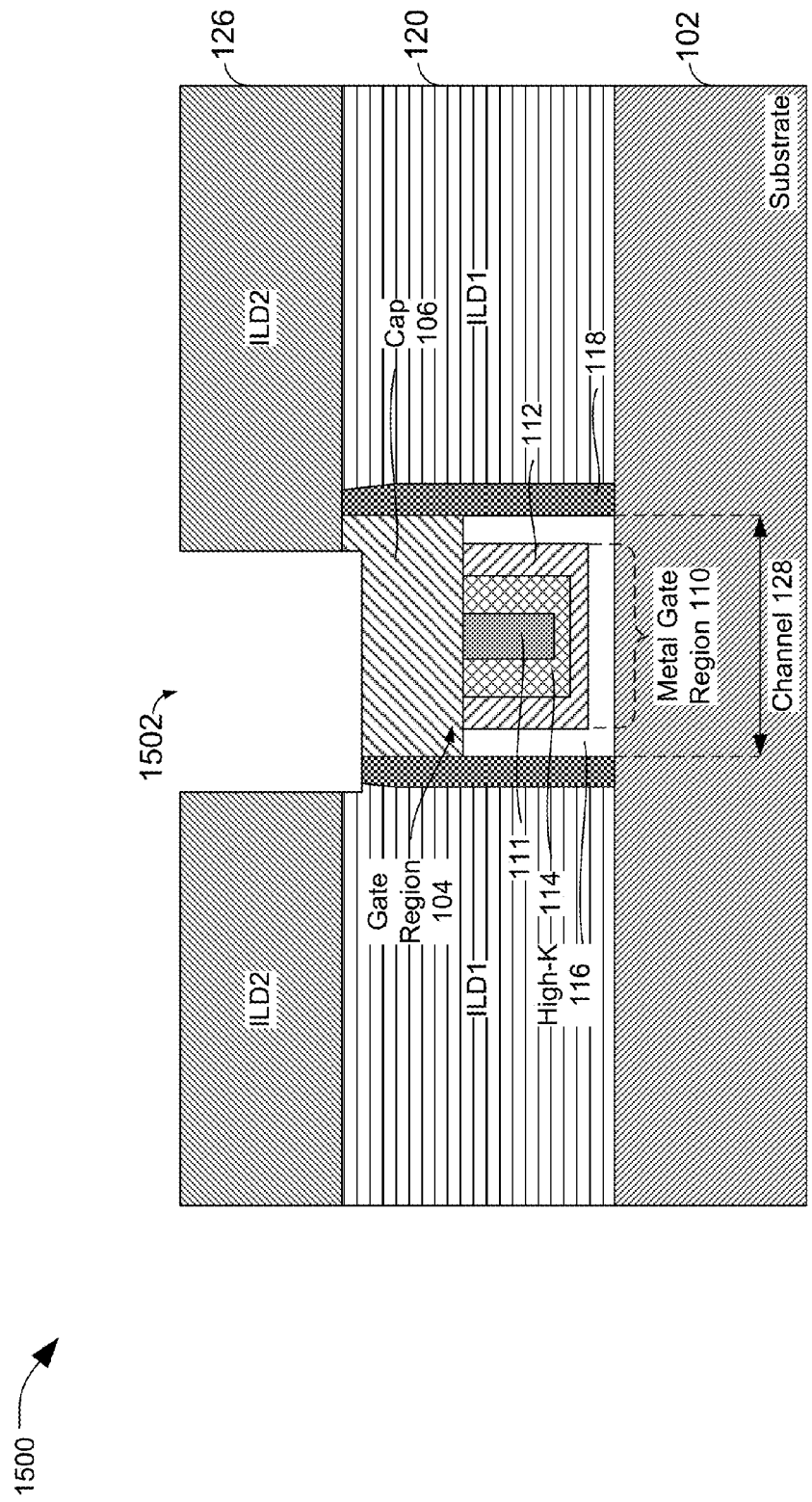
FIG. 15 is a diagram of a side view of the structure of FIG. 2 during at least one stage in a process of fabricating an electronic device.

FIGS. 14-17 illustrate the formation of an interconnect on the cap 106 after chemical-mechanical planarization. Referring to FIGS. 14-17, diagrams of side views of structures as formed during a process of fabricating an electronic device (including the structure 200 of FIG. 2) are illustrated and generally designated 1400, 1500, 1600, and 1700, respectively. FIG. 14 illustrates that the second ILD layer 126 may be formed, and FIG. 15 illustrates that a portion of the second ILD layer 126 may be removed (e.g., etched) to form a recess 1502 that exposes a surface of the cap 106. As further explained herein, for illustrative purposes only, FIG. 15 illustrates that forming the recess 1502 may also result in removal of a portion of spacer material (and a portion of the cap material).

Figure 16:
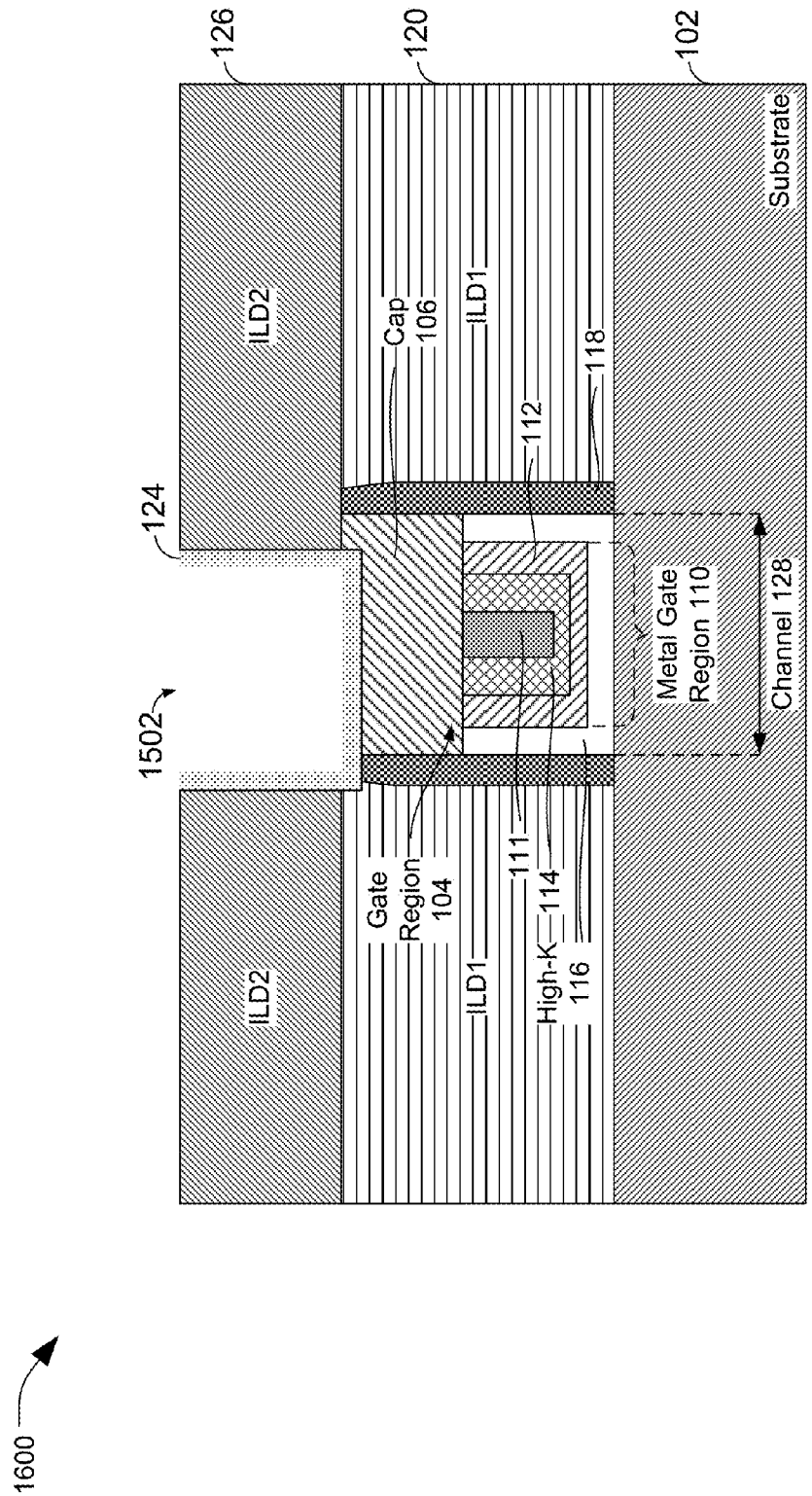
FIG. 16 is a diagram of a side view of the structure of FIG. 2 during at least one stage in a process of fabricating an electronic device.
Figure 17:
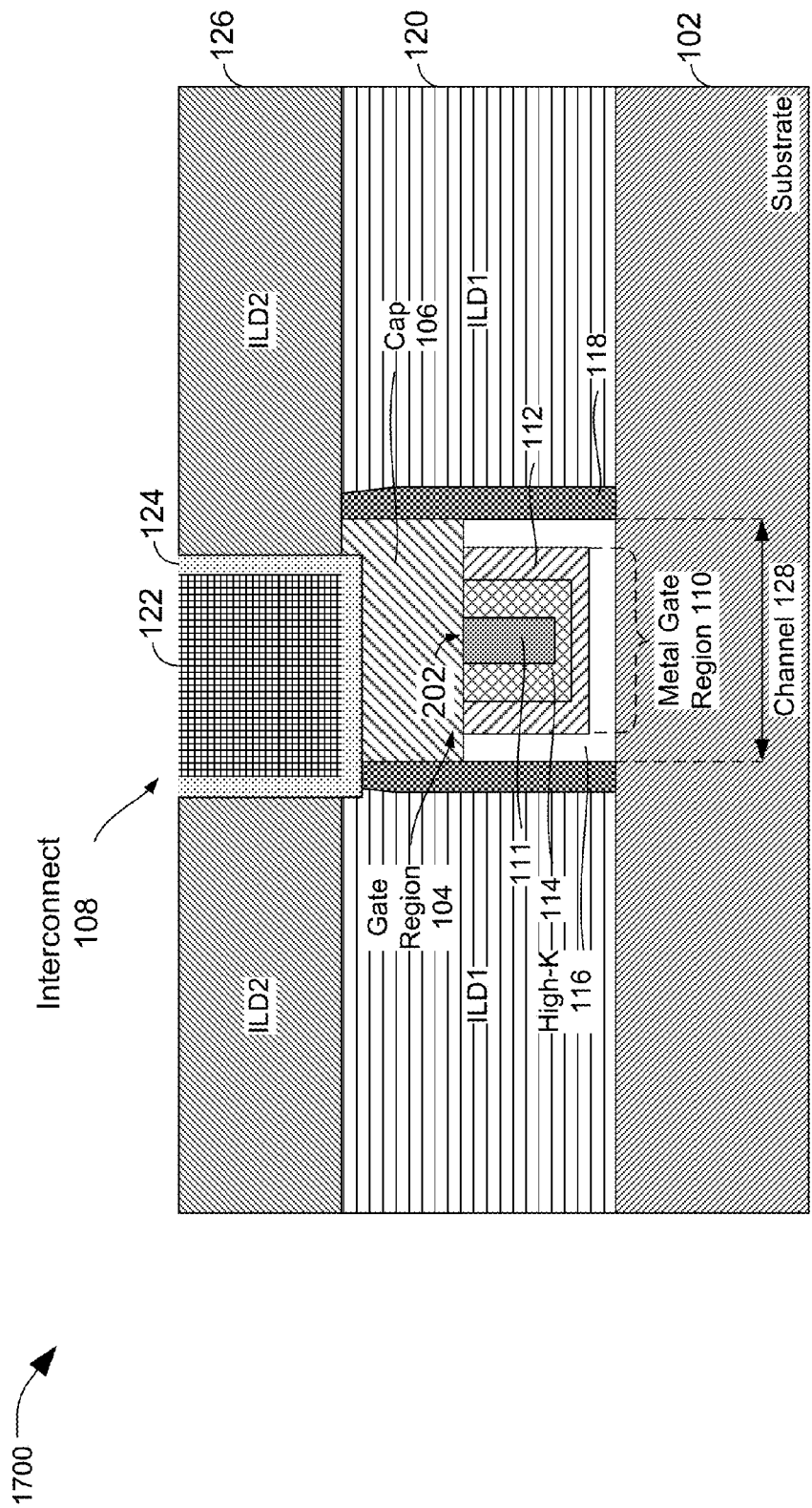
FIG. 17 is a diagram of a side view of the structure of FIG. 2 during at least one stage in a process of fabricating an electronic device.

FIGS. 16 and 17 illustrate a particular implementation in which the liner layer 124 may be deposited on the surface of the cap 106 prior to deposition of the interconnect metal 122 (e.g., a copper (Cu) layer). In alternative implementations, the interconnect metal 122 (e.g., Cu) may be deposited on the surface of the cap 106 without the intervening liner layer 124. In contrast to FIG. 10 in which the surface 404 of the gate metal layer 111 is disposed at a different distance from the interconnect 108 than the surface 406 of the high-K layer 116, FIG. 17 illustrates that the gate region 104 has a substantially flat surface 202 so the distances from the interconnect 108 are equal (or substantially equal).

Figure 18:
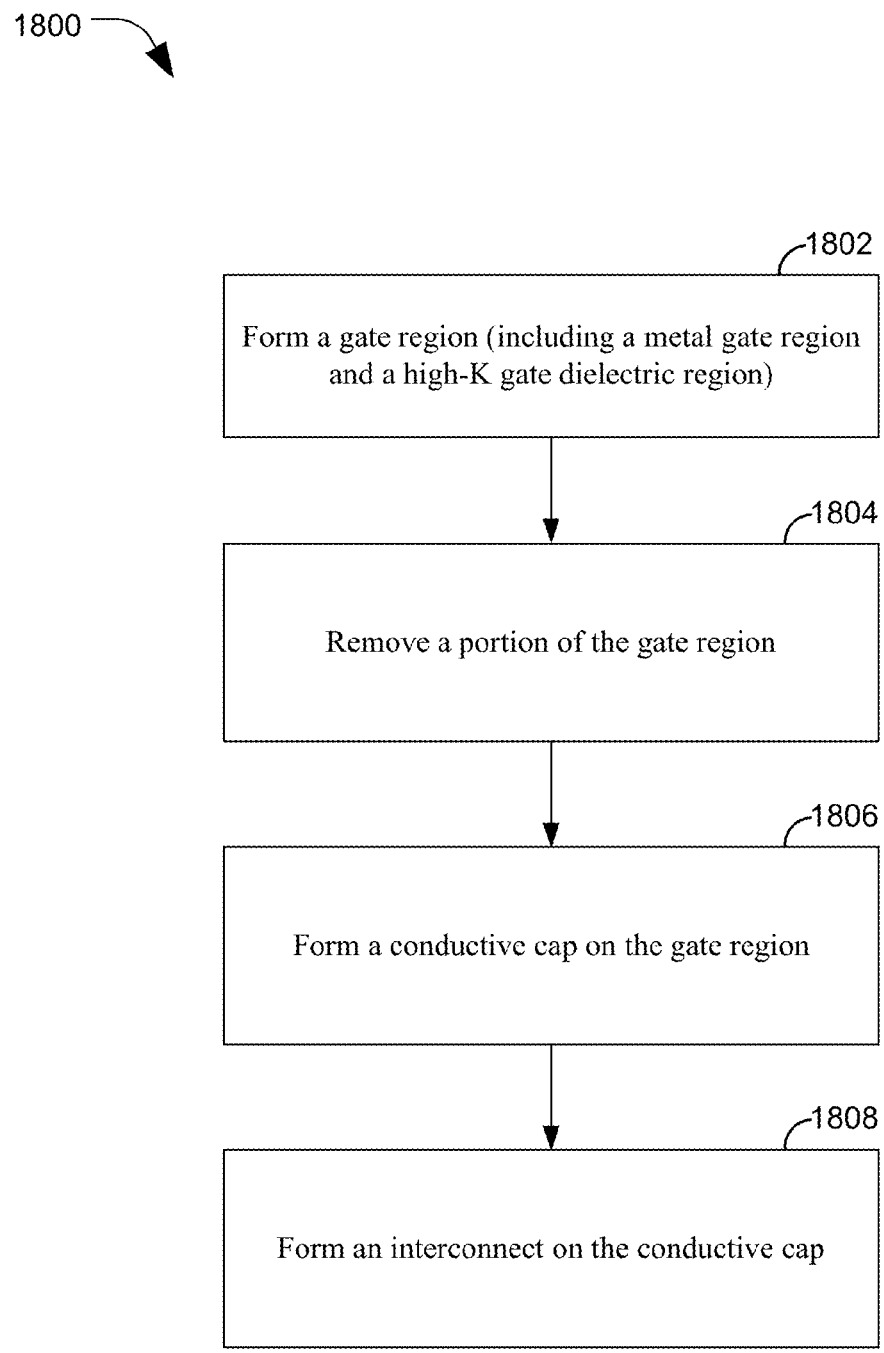
FIG. 18 is a flow chart of a particular illustrative example of a method of fabricating an electronic device.

FIG. 18 is a flow chart illustrating a particular instance of a method 1800 of fabricating a semiconductor device. In a particular instance, the semiconductor device may include the structure 100 of FIG. 1. In another instance, the semiconductor device may include the structure 200 of FIG. 2.

The method 1800 includes forming a gate region, at 1802. The gate region may include a gate metal region and a high-K gate dielectric region. For example, referring to FIG. 3, the high dielectric constant (high-K) layer 116 (e.g., a hafnium dioxide (HfO$_2$) layer) may be deposited on the structure 300. In a particular instance, the high-K layer 116 may be deposited using atomic layer deposition (ALD), among other alternatives. The first work function layer 112 may be deposited on the high-K layer 116, and the second work function layer 114 may be deposited on the first work function layer 112. In a particular instance, the first work function layer 112 may include a PMOS work-function metal layer, and the second work function layer 114 may include an NMOS work-function metal layer. Subsequent to deposition of the first work function layer 112 and the second work function layer 114, a gate metal layer 111 (e.g., a tungsten (W) layer) may be deposited on the structure 300 (e.g., using CVD). Chemical mechanical planarization (CMP) may be performed on the structure 300 subsequent to deposition of the gate metal layer 111.

The method 1800 includes removing a portion of the gate region, at 1804. As an example, referring to FIG. 4, the structure 300 of FIG. 3 may be etched to remove a portion of material from the metal gate region 110 (e.g., the gate metal layer 111 and the work function layers 112, 114) and to remove a portion of material from the high-K gate dielectric region (e.g., the high-K layer 116). As another example, referring to FIG. 11, the structure 300 of FIG. 3 may be etched to remove a portion of material from the metal gate region 110 (e.g., the gate metal layer 111 and the work function layers 112, 114) and to remove a portion of material from the high-K gate dielectric region (e.g., the high-K layer 116). In contrast to FIG. 4, FIG. 11 illustrates a particular example in which the etching of the structure 300 of FIG. 3 results in the gate region 104 having a substantially flat surface.

The method 1800 includes forming a conductive cap on the gate region, at 1806. As an example, referring to FIG. 5, the cap 106 may be formed on the gate region 104 of FIG. 4 by depositing cap material 502. As another example, referring to FIG. 12, the cap 106 may be formed on the gate region 104 of FIG. 11 by depositing cap material 1202. In a particular instance, forming the cap 106 on the gate region 104 may include depositing a tungsten (W) layer, a cobalt (Co) layer, or a tantalum (Ta) layer.

The method 1800 includes forming an interconnect on the conductive cap, at 1808. As an example, referring to FIGS. 6-10, a portion of the cap material 502 that is formed on the gate region 104 (as shown in FIG. 5) may be removed prior to forming the interconnect 108 of the structure 100 of FIG. 1. To illustrate, FIG. 6 shows that a portion of the cap material 502 may be removed (e.g., via CMP) to form the cap 106. FIG. 7 illustrates that the second ILD layer 126 may be formed after CMP, and FIG. 8 illustrates that the second ILD layer 126 may be etched to form the recess 802 that exposes a surface of the cap 106. In some implementations, a liner layer may be deposited on the surface of the cap 106 prior to forming the metal layer 122 of the interconnect 108. For example, FIGS. 9 and 10 illustrate that the liner layer 124 may be deposited in the recess 802, followed by deposition of the metal layer 122 (e.g., a copper (Cu) layer) on the surface of the liner layer 124. In alternative implementations, the metal layer 122 (e.g., the Cu layer) may be deposited directly on the surface of the cap 106.

As another example, referring to FIGS. 12-17, a portion of the cap material 1202 that is formed on the gate region 104 (as shown in FIG. 12) may be removed prior to forming the interconnect 108 of the structure 200 of FIG. 2. To illustrate, FIG. 13 shows that a portion of the cap material 1202 may be removed (e.g., via CMP) to form the cap 106. FIG. 14 illustrates that the second ILD layer 126 may be formed after CMP, and FIG. 15 illustrates that the second ILD layer 126 may be etched to form the recess 1502 that exposes a surface of the cap 106. In some implementations, a liner layer may be deposited on the surface of the cap 106 prior to forming the metal layer 122 of the interconnect 108. For example, FIGS. 16 and 17 illustrate that the liner layer 124 may be deposited in the recess 1502, followed by deposition of the metal layer 122 (e.g., a copper (Cu) layer) on the surface of the liner layer 124. In alternative implementations, the metal layer 122 (e.g., the Cu layer) may be deposited directly on the surface of the cap 106.

The method 1800 may enable fabrication of a semiconductor device including a conductive cap that is disposed on a gate region to electrically connect an interconnect to the gate region. The cap may allow a material with a lower resistivity (e.g., copper) to be used as the interconnect material by substantially inhibiting solid-state diffusion of copper (Cu) from the interconnect through the gate region to a substrate, as compared to a semiconductor device without a cap that may utilize a different interconnect material (e.g., W) with a higher resistivity than copper (Cu). Further, the cap may substantially inhibit solid-state diffusion of work function material from the gate region into the interconnect (that may be associated with Vt fluctuation).

Referring to FIG. 19, a block diagram of a particular illustrative example of an electronic device (e.g., a wireless communication device) is depicted and generally designated 1900. The electronic device 1900 includes a processor, such as a digital signal processor (DSP) 1910, coupled to a memory 1932. The electronic device 1900 includes a metal-gate transistor 1964 (e.g., a HKMG transistor) that includes a cap disposed on a gate region of the metal-gate transistor 1964 and an interconnect disposed on the cap. In an illustrative implementation, the metal-gate transistor 1964 may correspond to (or may be included within) the structure 100 of FIG. 1 or the structure 200 of FIG. 2. While FIG. 19 illustrates an example in which the memory 1932 may include the metal-gate transistor 1964, it will be appreciated that the metal-gate transistor 1964 may be included within alternative and/or additional components of the electronic device 1900.

FIG. 19 also shows a display controller 1926 that is coupled to the digital signal processor 1910 and to a display 1928. A coder/decoder (CODEC) 1934 can also be coupled to the digital signal processor 1910. A speaker 1936 and a microphone 1938 can be coupled to the CODEC 1934.

FIG. 19 also indicates that a wireless controller 1940 can be coupled to the digital signal processor 1910 and to an antenna 1942. In a particular implementation, the DSP 1910, the display controller 1926, the memory 1932, the CODEC 1934, and the wireless controller 1940 are included in a system-in-package or system-on-chip device 1922. In a particular implementation, an input device 1930 and a power supply 1944 are coupled to the system-on-chip device 1922.

Moreover, in a particular implementation, as illustrated in FIG. 19, the display 1928, the input device 1930, the speaker 1936, the microphone 1938, the antenna 1942, and the power supply 1944 are external to the system-on-chip device 1922. However, each of the display 1928, the input device 1930, the speaker 1936, the microphone 1938, the antenna 1942, and the power supply 1944 can be coupled to a component of the system-on-chip device 1922, such as an interface or a controller.

In conjunction with the described implementations, an apparatus is disclosed that may include means for gating a channel of a semiconductor device, the means for gating including a metal gate region and a high-K gate dielectric region, such as the gate region 104 of the structure 100 of FIG. 1 or the structure 200 of FIG. 2. For example, the channel may have a channel length that is less than 20 nanometers (nm), such as the channel 128 of the structure 100 of FIG. 1 or the structure 200 of FIG. 2. The apparatus may also include means for capping the metal gate region and the high-K gate dielectric region, such as the cap 106 of the structure 100 of FIG. 1 or the structure 200 of FIG. 2. The apparatus may further includes means for interconnecting the means for capping to circuitry of the semiconductor device, such as the interconnect 108 of the structure 100 of FIG. 1 or the structure 200 of FIG. 2. For example, the means for capping may include means for inhibiting solid-state diffusion of conductor material (e.g., Cu) from the means for interconnecting into the means for gating. As another example, the means for capping may include means for inhibiting solid-state diffusion of work function material from the metal gate region into the means for interconnecting.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include wafers that are then cut into die and packaged into a chip. The chips are then integrated into electronic devices (e.g., a memory device, a logic device, a semiconductor device, an integrated circuit, another device that includes a transistor, etc.), as described further with reference to FIG. 20.

Referring to FIG. 20, a particular illustrative example of an electronic device manufacturing (e.g., fabricating) process is depicted and generally designated 2000. Physical device information 2002 is received at the manufacturing process 2000, such as at a research computer 2006. The physical device information 2002 may include design information representing at least one physical property of a semiconductor device that includes a cap that is disposed on a gate region to electrically connect an interconnect to the gate region, such as the structure 100 of FIG. 1 or the structure 200 of FIG. 2. For example, the physical device information 2002 may include physical parameters, material characteristics, and structure information (e.g., of the cap 106, the metal gate region 110, including the gate metal layer 111 and the work function layer(s) 112, 114, the high-K gate dielectric region 116, the interconnect 108, and the liner layer 122) that is entered via a user interface 2004 coupled to the research computer 2006. The research computer 2006 includes a processor 2008, such as one or more processing cores, coupled to a computer readable medium (e.g., a non-transitory computer-readable medium), such as a memory 2010. The memory 2010 may store computer readable instructions that are executable to cause the processor 2008 to transform the physical device information 2002 to comply with a file format and to generate a library file 2012.

In a particular implementation, the library file 2012 includes at least one data file including the transformed design information. For example, the library file 2012 may include a library of semiconductor devices including the structure 100 of FIG. 1 or the structure 200 of FIG. 2 having a cap that is disposed on a gate region to electrically connect an interconnect to the gate region. The library file 2012 may be provided for use with an electronic design automation (EDA) tool 2020.

The library file 2012 may be used in conjunction with the EDA tool 2020 at a design computer 2014 including a processor 2016, such as one or more processing cores, coupled to a memory 2018. The EDA tool 2020 may be stored as processor executable instructions at the memory 2018 to enable a user of the design computer 2014 to design a circuit including the structure 100 or the structure 200 having a cap that is disposed on a gate region to electrically connect an interconnect to the gate region using the library file 2012. For example, a user of the design computer 2014 may enter circuit design information 2022 via a user interface 2024 coupled to the design computer 2014. The circuit design information 2022 may include design information representing at least one physical property of the electronic device that includes a cap that is disposed on a gate region to electrically connect an interconnect to the gate region, such as the structure 100 of FIG. 1 or the structure 200 of FIG. 2. To illustrate, the circuit design property may include identification of particular circuits and relationships to other elements in a circuit design, positioning information, feature size information, interconnection information, or other information representing a physical property of a semiconductor device.

The design computer 2014 may be configured to transform the design information, including the circuit design information 2022, to comply with a file format. To illustrate, the file formation may include a database binary file format representing planar geometric shapes, text labels, and other information about a circuit layout in a hierarchical format, such as a Graphic Data System (GDSII) file format. The design computer 2014 may be configured to generate a data file including the transformed design information, such as a GDSII file 2026 that includes information describing the electronic device that includes a cap that is disposed on a gate region to electrically connect an interconnect to the gate region, in addition to other circuits or information. To illustrate, the data file may include information corresponding to a system-on-chip (SOC) that includes a semiconductor device having a cap that is disposed on a gate region to electrically connect an interconnect to the gate region, such as the structure 100 of FIG. 1 or the structure 200 of FIG. 2, and that also includes additional electronic circuits and components within the SOC.

The GDSII file 2026 may be received at a fabrication process 2028 to manufacture a semiconductor device that includes a cap that is disposed on a gate region to electrically connect an interconnect to the gate region, such as the structure 100 of FIG. 1 or the structure 200 of FIG. 2, according to transformed information in the GDSII file 2026. For example, a device manufacture process may include providing the GDSII file 2026 to a mask manufacturer 2030 to create one or more masks, such as masks to be used with photolithography processing, illustrated as a representative mask 2032. The mask 2032 may be used during the fabrication process to generate one or more wafers 2034, which may be tested and separated into dies, such as a representative die 2036. The die 2036 includes a circuit including a device that includes a cap that is disposed on a gate region to electrically connect an interconnect to the gate region, such as the structure 100 of FIG. 1 or the structure 200 of FIG. 2.

For example, the fabrication process 2028 may include a processor 2027 and a memory 2029 to initiate and/or control the fabrication process 2028. The memory 2029 may include executable instructions such as computer-readable instructions or processor-readable instructions. The executable instructions may include one or more instructions that are executable by a computer such as the processor 2027. In a particular instance, the executable instructions may cause a computer to perform the method 1800 of FIG. 18 or at least a portion thereof.

The fabrication process 2028 may be implemented by a fabrication system that is fully automated or partially automated. For example, the fabrication process 2028 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD). As other examples, the fabrication equipment may, additionally or alternatively, be configured to pattern materials using a single-mask or multi-mask litho-etch process (e.g., two-mask LELE), to pattern materials using a litho-etch-litho-etch (LELE) process, to pattern materials using a self-aligned double patterning (SADP) process, to epitaxially grow one or more materials, and/or to conformally deposit one or more materials. As a further example, the fabrication equipment may, additionally or alternatively, be configured to apply a hardmask, to apply an etching mask, to perform etching, to perform planarization, to form a gate stack, and/or to perform a standard clean 1 type. In a particular instance, the fabrication process 2028 corresponds to a semiconductor manufacturing process associated with a technology node smaller than 14 nm (e.g., 10 nm, 7 nm, etc.). The specific process or combination of processes used to manufacture a device including the structure 100 of FIG. 1 or the structure 200 of FIG. 2 may be based on design constraints and available materials/equipment. Thus, in particular instances, different processes may be used than described with reference to FIGS. 1-17 to manufacture the device.

The fabrication system (e.g., an automated system that performs the fabrication process 2028) may have a distributed architecture (e.g., a hierarchy). For example, the fabrication system may include one or more processors, such as the processor 2027, one or more memories, such as the memory 2029, and/or controllers that are distributed according to the distributed architecture. The distributed architecture may include a high-level processor that controls or initiates operations of one or more low-level systems. For example, a high-level portion of the fabrication process 2028 may include one or more processors, such as the processor 2027, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 2027.

Alternatively, the processor 2027 may be a part of a high-level system, subsystem, or component of the fabrication system. In another implementation, the processor 2027 includes distributed processing at various levels and components of a fabrication system.

The executable instructions included in the memory 2029 may enable the processor 2027 to form (or to initiate formation of) the gate region 104 (e.g., the metal gate region 110, including the gate metal layer 111, the work function layers 112, 114, and the high-K gate dielectric region 116) on the substrate 102, the cap 106 on the surface of the metal gate region 110 and on the surface of the high-K gate dielectric region 116, and the interconnect 108 on the cap 106 of the structure 100 of FIG. 1 or the structure 200 of FIG. 2. In a particular instance, the memory 2029 is a non-transitory computer-readable medium storing computer-executable instructions that are executable by the processor 2027 to cause the processor 2027 to initiate formation of a device in accordance with at least a portion of the method 1800 of FIG. 18. For example, the computer executable instructions may be executable to cause the processor 2027 to initiate formation of the gate region 104 (e.g., the metal gate region 110, including the gate metal layer 111 and the work function layers 112, 114, and the high-K gate dielectric region 116) on the substrate 102 and to initiate removal of a first portion of material from the metal gate region 110 and a second portion of material from the high-K gate dielectric region 116. The computer executable instructions may be further executable to cause the processor 2027 to initiate formation of formation of the cap 106 on the surface of the metal gate region 110 and on the surface of the high-K gate dielectric region 116. The computer executable instructions may be further executable to cause the processor 2027 to initiate formation of the interconnect 108 on the cap 106. As an illustrative example, the processor 2027 may initiate or control one or more steps of the method 1800 of FIG. 18.

The die 2036 may be provided to a packaging process 2038 where the die 2036 is incorporated into a representative package 2040. For example, the package 2040 may include the single die 2036 or multiple dies, such as a system-in-package (SiP) arrangement. The package 2040 may be configured to conform to one or more standards or specifications, such as Joint Electron Device Engineering Council (JEDEC) standards.

Information regarding the package 2040 may be distributed to various product designers, such as via a component library stored at a computer 2046. The computer 2046 may include a processor 2048, such as one or more processing cores, coupled to a memory 2050. A printed circuit board (PCB) tool may be stored as processor executable instructions at the memory 2050 to process PCB design information 2042 received from a user of the computer 2046 via a user interface 2044. The PCB design information 2042 may include physical positioning information of a packaged semiconductor device on a circuit board, the packaged semiconductor device corresponding to the package 2040 including the structure 100 of FIG. 1 or the structure 200 of FIG. 2.

The computer 2046 may be configured to transform the PCB design information 2042 to generate a data file, such as a GERBER file 2052 with data that includes physical positioning information of a packaged semiconductor device on a circuit board, as well as layout of electrical connections such as traces and vias, where the packaged semiconductor device corresponds to the package 2040 that includes the structure 100 of FIG. 1 or the structure 200 of FIG. 2. In other implementations, the data file generated by the transformed PCB design information may have a format other than a GERBER format.

The GERBER file 2052 may be received at a board assembly process 2054 and used to create PCBs, such as a representative PCB 2056, manufactured in accordance with the design information stored within the GERBER file 2052. For example, the GERBER file 2052 may be uploaded to one or more machines to perform various steps of a PCB production process. The PCB 2056 may be populated with electronic components including the package 2040 to form a representative printed circuit assembly (PCA) 2058.

The PCA 2058 may be received at a product manufacture process 2060 and integrated into one or more electronic devices, such as a first representative electronic device 2062 and a second representative electronic device 2064. As an illustrative, non-limiting example, the first representative electronic device 2062, the second representative electronic device 2064, or both, may include or correspond to the wireless communication device 1900 of FIG. 19. As an illustrative, non-limiting example, the first representative electronic device 2062, the second representative electronic device 2064, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 2062, the second representative electronic device 2064, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the structure including a cap that is disposed on a gate region to electrically connect the interconnect to the gate region, such as the structure 100 of FIG. 1 or the structure 200 of FIG. 2, is integrated.

As another illustrative, non-limiting example, one or more of the electronic devices 2062 and 2064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 20 illustrates remote units according to teachings of the disclosure, the disclosure is not limited to these illustrated units. Implementations of the disclosure may be suitably employed in any device which includes active integrated circuitry including memory and on-chip circuitry.

A device that includes a semiconductor device having a cap that is disposed on a gate region to electrically connect an interconnect to the gate region, may be fabricated, processed, and incorporated into an electronic device, as described in the illustrative process 2000. One or more aspects of the implementations disclosed with respect to FIGS. 1-19 may be included at various processing stages, such as within the library file 2012, the GDSII file 2026, and the GERBER file 2052, as well as stored at the memory 2010 of the research computer 2006, the memory 2018 of the design computer 2014, the memory 2050 of the computer 2046, the memory of one or more other computers or processors (not shown) used at the various stages, such as at the board assembly process 2054, and also incorporated into one or more other physical implementations such as the mask 2032, the die 2036, the package 2040, the PCA 2058, other products such as prototype circuits or devices (not shown), or any combination thereof. Although various representative stages of production from a physical device design to a final product are depicted, in other implementations fewer stages may be used or additional stages may be included. Similarly, the process 2000 may be performed by a single entity or by one or more entities performing various stages of the process 2000.

Although one or more of FIGS. 1-20 may illustrate systems, devices, and/or methods according to the teachings of the disclosure, the disclosure is not limited to these illustrated systems, devices, and/or methods. Implementations of the disclosure may be suitably employed in any device that includes integrated circuitry including memory, a processor, and on-chip circuitry.

One or more functions or components of any of FIGS. 1-20 as illustrated or described herein may be combined with one or more other portions of another of FIGS. 1-20. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the examples disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the examples shown herein but is to be accorded the widest scope possible consistent with the principles and novel features as defined by the following claims.

What is claimed is:

1. A semiconductor device comprising:
   a gate region, wherein the gate region includes a metal gate region and a high dielectric constant (high-K) gate dielectric region;
   a conductive cap disposed on a surface of the metal gate region and in direct contact with a surface of the high-K gate dielectric region; and
   an interconnect disposed on the conductive cap, wherein the conductive cap includes a conductive material to electrically connect the gate region to the interconnect.

2. The semiconductor device of claim 1, wherein the interconnect includes copper (Cu), and wherein the conductive cap substantially inhibits diffusion of the copper (Cu) from the interconnect into the gate region.

3. The semiconductor device of claim 2, wherein the interconnect further includes a liner material that is positioned between the copper (Cu) and the conductive cap.

4. The semiconductor device of claim 1, wherein the metal gate region includes a work function material disposed between a gate metal of the metal gate region and the high-K gate dielectric region.

5. The semiconductor device of claim 4, wherein the conductive cap substantially inhibits diffusion of the work function material from the metal gate region into the interconnect.

6. The semiconductor device of claim 1, wherein the conductive material of the conductive cap includes tungsten (W), cobalt (Co), or tantalum (Ta).

7. The semiconductor device of claim 1, wherein a gate metal of the metal gate region includes aluminum (Al) or tungsten (W).

8. The semiconductor device of claim 1, wherein the metal gate region comprises a metal gate, and wherein the conductive cap is in contact with a first surface of the metal gate and is in contact with a portion of a second surface of the metal gate.

9. The semiconductor device of claim 1, wherein the metal gate region comprises a first work function layer and a second work function layer, wherein the first work function layer is disposed on the high-K gate dielectric region and the second work function layer is disposed on the first work function layer, and wherein the first work function layer comprises a p-type metal oxide semiconductor (PMOS) work function metal layer and the second work function layer comprises an n-type metal oxide semiconductor (NMOS) work function metal layer.

10. The semiconductor device of claim 1, wherein the gate region is disposed within a channel of an inter-layer dielectric (ILD) layer, wherein the channel is defined by a recess in the ILD layer exposing a surface of a substrate, wherein the ILD layer is disposed on the surface of the substrate, and wherein the channel has a channel length that is less than 20 nanometers (nm).

11. The semiconductor device of claim 10, further comprising a first spacer layer and a second spacer layer disposed on opposing sides of the gate region.

12. A semiconductor device comprising:
    a gate region, wherein the gate region includes a metal gate region and a high dielectric constant (high-K) gate dielectric region, wherein the metal gate region comprises a metal gate;
    a conductive cap disposed on a surface of the metal gate region and on a surface of the high-K gate dielectric region, wherein the conductive cap is in contact with a first surface of the metal gate and is in contact with a portion of a second surface of the metal gate; and
    an interconnect disposed on the conductive cap, wherein the conductive cap includes a conductive material that electrically connects the gate region to the interconnect.

13. The semiconductor device of claim 12, wherein the interconnect includes copper (Cu), and wherein the conductive cap substantially inhibits diffusion of the copper (Cu) from the interconnect into the gate region.

14. The semiconductor device of claim 13, wherein the interconnect further includes a liner material that is positioned between the copper (Cu) and the conductive cap.

15. The semiconductor device of claim 12, wherein the metal gate region includes a work function material disposed between a gate metal of the metal gate region and the high-K gate dielectric region.

16. The semiconductor device of claim 15, wherein the conductive cap substantially inhibits diffusion of the work function material from the metal gate region into the interconnect.

17. The semiconductor device of claim 12, wherein the metal gate region comprises a first work function layer and a second work function layer, wherein the first work function layer is disposed on the high-K gate dielectric region and the second work function layer is disposed on the first work function layer, and wherein the first work function layer comprises a p-type metal oxide semiconductor (PMOS) work function metal layer and the second work function layer comprises an n-type metal oxide semiconductor (NMOS) work function metal layer.

18. The semiconductor device of claim 12, wherein the conductive material of the conductive cap includes tungsten (W), cobalt (Co), or tantalum (Ta), and wherein a gate metal of the metal gate region includes aluminum (Al) or tungsten (W).

19. The semiconductor device of claim 12, wherein the gate region is disposed within a channel of an inter-layer dielectric (ILD) layer, wherein the channel is defined by a recess in the ILD layer exposing a surface of a substrate, wherein the ILD layer is disposed on the surface of the substrate, and wherein the channel has a channel length that is less than 20 nanometers (nm).

20. A semiconductor device comprising:
    a gate region, wherein the gate region includes a metal gate region and a high dielectric constant (high-K) gate dielectric region, wherein the metal gate region comprises a first work function layer and a second work function layer, wherein the first work function layer is disposed on the high-K gate dielectric region and the second work function layer is disposed on the first work function layer;
    a conductive cap disposed on a surface of the metal gate region and on a surface of the high-K gate dielectric region; and an interconnect disposed on the conductive cap, wherein the conductive cap includes a conductive material to electrically connect the gate region to the interconnect.

21. The semiconductor device of claim 20, wherein the interconnect includes copper (Cu), and wherein the conductive cap substantially inhibits diffusion of the copper (Cu) from the interconnect into the gate region.

22. The semiconductor device of claim 21, wherein the interconnect further includes a liner material that is positioned between the copper (Cu) and the conductive cap.

23. The semiconductor device of claim 20, wherein the conductive cap substantially inhibits diffusion of a work function material of the first and second work function layers from the metal gate region into the interconnect.

24. The semiconductor device of claim 20, wherein the conductive material of the conductive cap includes tungsten (W), cobalt (Co), or tantalum (Ta), and wherein a gate metal of the metal gate region includes aluminum (Al) or tungsten (W).

25. The semiconductor device of claim 20, wherein the first work function layer comprises a p-type metal oxide semiconductor (PMOS) work function metal layer and the second work function layer comprises an n-type metal oxide semiconductor (NMOS) work function metal layer.

26. The semiconductor device of claim 20, wherein the gate region is disposed within a channel of an inter-layer dielectric (ILD) layer, wherein the channel is defined by a recess in the ILD layer exposing a surface of a substrate, wherein the ILD layer is disposed on the surface of the substrate, and wherein the channel has a channel length that is less than 20 nanometers (nm).

* * * * *